(12) United States Patent
Kim

(10) Patent No.: US 7,279,371 B2
(45) Date of Patent: Oct. 9, 2007

(54) THIN FILM TRANSISTOR ARRAY PANEL AND MANUFACTURING METHOD THEREOF

(75) Inventor: Hee-Joon Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 111 days.

(21) Appl. No.: 11/008,729

(22) Filed: Dec. 8, 2004

(65) Prior Publication Data

US 2005/0158925 A1   Jul. 21, 2005

(30) Foreign Application Priority Data

Dec. 8, 2003   (KR) ...................... 10-2003-0088622

(51) Int. Cl.
*H01L 21/8234* (2006.01)
(52) U.S. Cl. .................... 438/158; 438/164; 438/30; 257/72; 257/E21.411; 349/46
(58) Field of Classification Search ............... 438/158, 438/164, 30; 257/72, E21.411; 349/46
See application file for complete search history.

(56) References Cited

U.S. PATENT DOCUMENTS

| | | | | | |
|---|---|---|---|---|---|
| 4,885,616 A | * | 12/1989 | Ohta | ........................... | 257/59 |
| 4,889,983 A | * | 12/1989 | Numano et al. | ............... | 257/53 |
| 5,084,905 A | * | 1/1992 | Sasaki et al. | ................ | 257/776 |
| 5,153,754 A | * | 10/1992 | Whetten | ...................... | 349/147 |
| 5,371,398 A | * | 12/1994 | Nishihara | .................... | 257/435 |
| 5,677,211 A | * | 10/1997 | Kaneko | ....................... | 438/158 |
| 6,271,543 B1 | * | 8/2001 | Ohtani et al. | .................. | 257/72 |
| 2001/0032981 A1 | * | 10/2001 | Kong et al. | .................... | 257/72 |

\* cited by examiner

*Primary Examiner*—B. William Baumeister
*Assistant Examiner*—Steven J. Fulk
(74) *Attorney, Agent, or Firm*—MacPherson Kwok Chen & Heid LLP

(57) ABSTRACT

A method of manufacturing a thin film transistor array panel is provided, which includes: forming a gate line on a substrate; depositing a first insulating layer and a semiconductor layer in sequence on the gate line; depositing a conductive layer on the semiconductor layer; photo-etching the conductive layer and the semiconductor layer; depositing a second insulating layer; photo-etching the second insulating layer to expose first and second portions of the conductive layer; forming a pixel electrode on the first portion of the conductive layer; removing the second portion of the conductive layer to expose a portion of the semiconductor layer; and forming a light blocking member on the exposed portion of the semiconductor layer, the light blocking member having an opening exposing the pixel electrode.

23 Claims, 47 Drawing Sheets

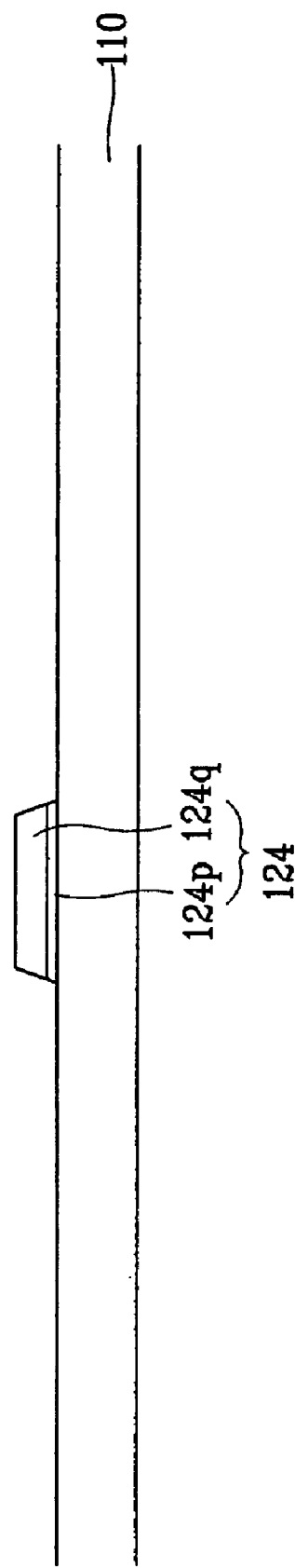

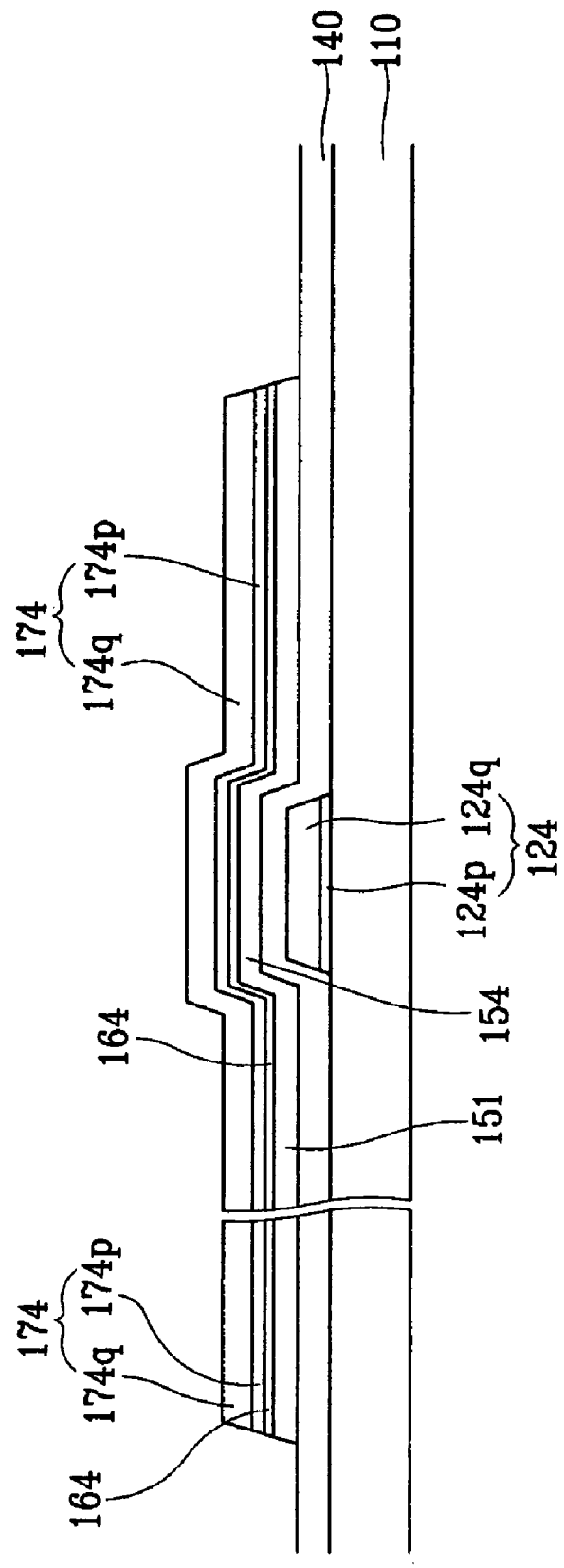

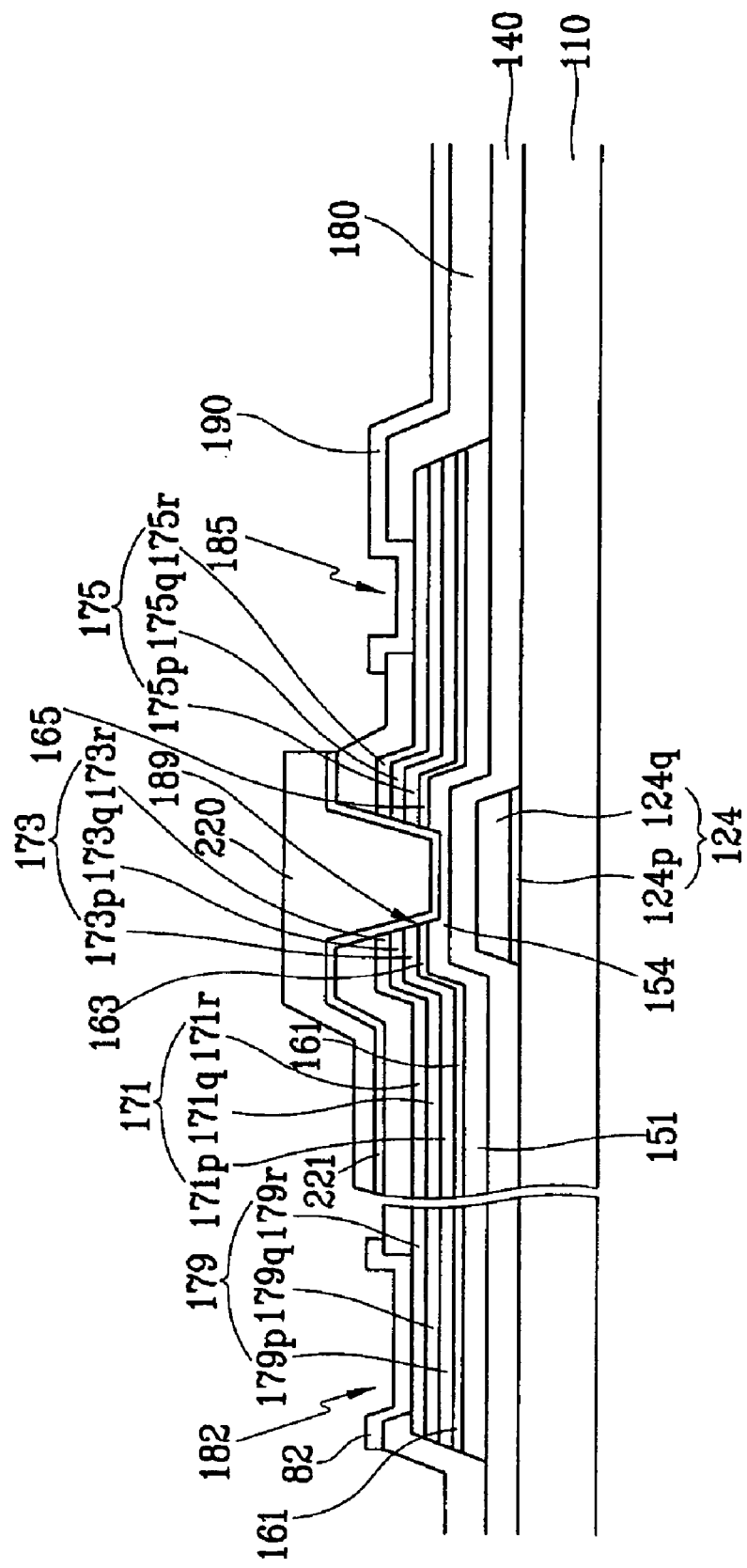

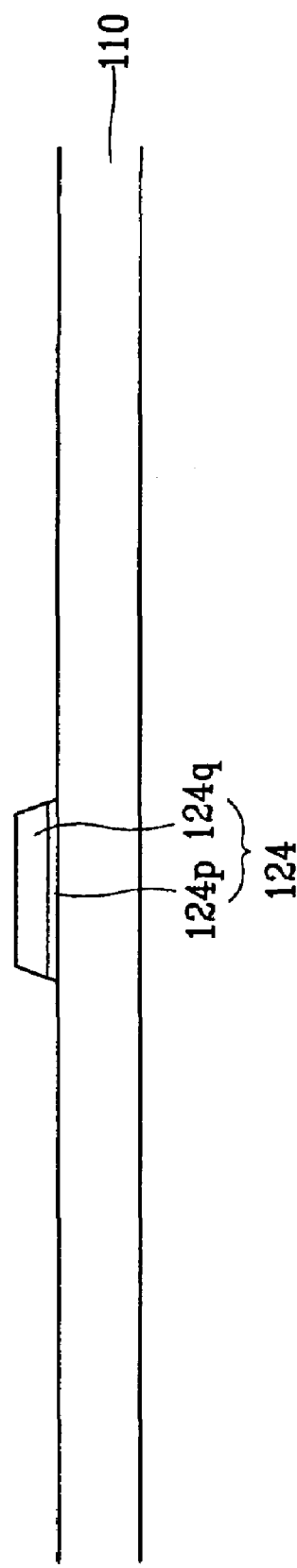

THIN FILM TRANSISTOR ARRAY PANEL AND MANUFACTURING METHOD THEREOF

BACKGROUND OF THE INVENTION (a) Field of the Invention

The present invention relates to a thin film transistor array panel and a manufacturing method thereof.

(b) Description of the Related Art

A liquid crystal display (LCD) is one of the most widely used flat panel displays since it is lightweight and occupies less space than conventional cathode ray tube (CRT) displays. An LCD generally includes a liquid crystal (LC) layer that is interposed between a pair of panels including field-generating electrodes such as pixel electrodes and a common electrode. The LC layer is subjected to an electric field generated by the field-generating electrodes and variations in the field strength change the molecular orientation of the LC layer. For example, upon application of an electric field, the molecules of the LC layer change their orientation to change polarization of incident light. Appropriately arranged polarizers partially or fully block the light, creating gray or dark areas that can represent desired images.

One panel for the LCD generally includes a plurality of pixel electrodes, a plurality of thin film transistors (TFTs) for controlling signals to be applied to the pixel electrodes, a plurality of gate lines transmitting control signals for controlling the TFTs, and a plurality of data lines transmitting data voltages to be supplied to the pixel electrodes. The other panel generally includes a common electrode disposed on an entire surface thereof.

The TFT array panel including the TFTs includes several conductive films and insulting films. The gate lines, the data lines, and the pixel electrodes are formed of different films and they are separated by insulating films and sequentially arranged from bottom to top.

The TFT array panel is manufactured by several steps of film deposition and photolithography steps. Accordingly, it is important to obtain stable elements using a minimum process steps.

SUMMARY OF THE INVENTION

A motivation of the present invention is to solve the problems of the conventional art.

A method of manufacturing a thin film transistor array panel is provided, which includes: forming a gate line on a substrate; depositing a first insulating layer and a semiconductor layer in sequence on the gate line; depositing a conductive layer on the semiconductor layer; photo-etching the conductive layer and the semiconductor layer; depositing a second insulating layer; photo-etching the second insulating layer to expose first and second portions of the conductive layer; forming a pixel electrode on the first portion of the conductive layer; removing the second portion of the conductive layer to expose a portion of the semiconductor layer; and forming a light blocking member on the exposed portion of the semiconductor layer, the light blocking member having an opening exposing the pixel electrode.

The method may further include: forming a third insulating layer between the semiconductor layer and the light blocking member.

The third insulating layer may have substantially the same planar shape as the light blocking member.

The photo-etching of the second insulating layer may include: exposing a third portion of the conductive layer.

The method may further include: forming a contact assistant on the third portion of the conductive layer.

The photo-etching of the second insulating layer may include: exposing a portion of the gate line.

The method may further include: forming a contact assistant on the exposed portion of the gate line.

The gate line may include a lower film and an upper film.

The photo-etching of the second insulating layer may include: etching the first insulating layer to expose a portion of the upper film of the gate line.

The method may further include: removing the exposed portion of the upper film of the gate line to expose a portion of the lower film of the gate line.

The formation of a pixel electrode and the removal of the second portion of the conductive layer may be simultaneously performed.

The conductive layer may include Cr and the pixel electrode may include IZO.

The gate line and the conductive layer may include either or both of Al and Mo and the pixel electrode may include ITO.

The semiconductor layer may include an intrinsic film and an extrinsic film, and the method may further include: removing the exposed portion of the extrinsic film after removing the second portion of the conductive layer.

The conductive layer may include: a lower film and an upper film. The photo-etching of the second insulating layer may include: removing the first and the second portions of the conductive layer to expose the first and the second portions of the upper film. The method may further include: forming first and second redundant electrodes on the second portion of the conductively layer.

The upper film may include Cr, and the pixel electrodes and the first and the second redundant electrodes may include IZO.

The formation of a pixel electrode, the formation of first and second redundant electrodes, and the removal of the second portion of the conductive layer may be simultaneously performed.

The formation of a pixel electrode, the formation of first and second redundant electrodes, and the removal of the second portion of the conductive layer may be performed with a single etch condition.

The photo-etching of the second insulating layer may expose the first portion of the conductive layer and an exposed portion of the first insulating layer.

A thin film transistor array panel is provided, which includes: a substrate; a gate line formed on the substrate and including a gate electrode; a first insulating layer formed on the gate line; a semiconductor layer formed on the first insulating layer; ohmic contacts formed on the semiconductor layer; source and drain electrodes formed on the ohmic contacts and disposed opposite each other with respect to the semiconductor layer; a second insulating layer formed on the source and the drain electrodes and having a first contact hole exposing a portion of the drain electrode and an opening exposing the first portion of the semiconductor layer and having an edge coinciding with edges of the source and the drain electrodes; a pixel electrode formed on the second insulating layer and contacting the drain electrode through the first contact hole; and a light blocking member covering the first portion of the semiconductor layer.

The edge of the opening may coincide with edges of the ohmic contacts.

The gate line may include a lower film and an upper film and the thin film transistor array panel may further include a contact assistant formed on the lower film.

The lower film and the upper film of the gate line may include Cr and Al, respectively.

The source and the drain electrodes may include Cr, and the pixel electrode may include IZO.

Each of the gate line and the source and the drain electrodes may include a first film including Al and a second film including Mo, and the pixel electrode may include ITO.

The source and the drain electrodes may include lower and upper films having edges disposed on the semiconductor layer and different from each other.

The thin film transistor array panel may further include first and second redundant electrodes including the same layer as the pixel electrode and contacting of the source and the drain electrodes in the opening.

The lower films of the source and the drain electrodes may have edges coinciding with edges of the first and the second redundant electrodes.

The first contact hole may expose a portion of the lower film of the drain electrode and a portion of the first insulating layer adjacent thereto.

The thin film transistor array panel may further include a third insulating layer formed on the exposed portion of the semiconductor layer.

BRIEF DESCRIPTION OF THE DRAWINGS

The present invention will become more apparent by describing embodiments thereof in detail with reference to the accompanying drawings in which:

FIGS. 4A and 4B are sectional views of the TFT array panel shown in FIG. 3 taken along the lines IVa-IVa' and IVb-IVb', respectively;

FIGS. 6A and 6B are sectional views of the TFT array panel shown in FIG. 5 taken along the lines VIa-VIa' and VIb-VIb', respectively;

FIGS. 25A and 25B are sectional views of the TFT array panel shown in FIG. 24 taken along the line XXVa-XXVa' and XXVb-XXVb', respectively;

FIGS. 27A and 27B are sectional views of the TFT array panel shown in FIG. 26 taken along the lines XXVIIa-XXVIIa' and XXVIIb-XXVIIb', respectively;

DETAILED DESCRIPTION OF EMBODIMENTS

Figure 1:
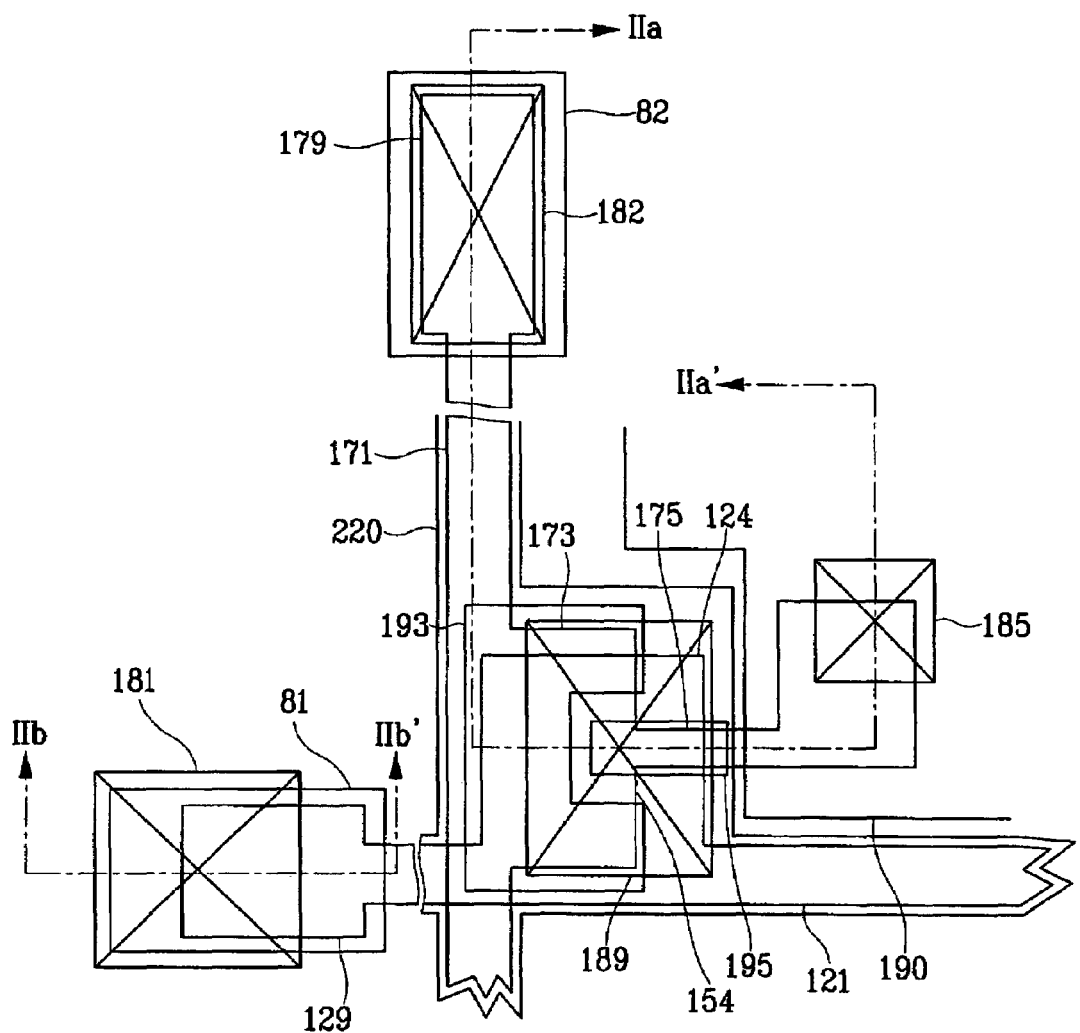
FIG. 1 is an exemplary layout view of a TFT array panel according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, TFT array panels and manufacturing methods thereof according to embodiments of the present invention will be described with reference to the accompanying drawings.

A TFT array panel for an LCD will be described in detail with reference to FIGS. 1, 2A and 2B.

Figure 2A:
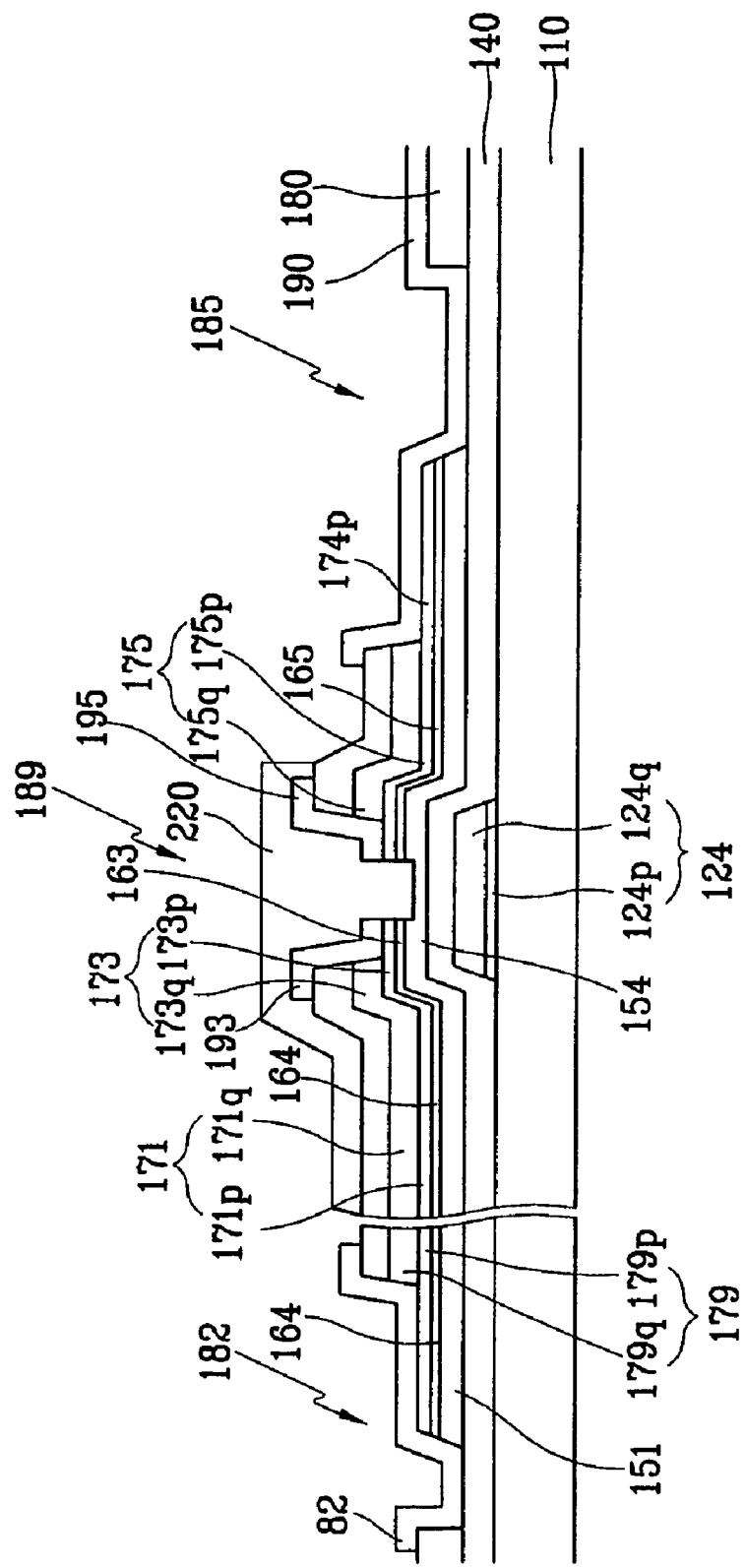
FIGS. 2A and 2B are sectional views of the TFT array panel shown in FIG. 1 taken along the lines IIa-IIa' and IIb-IIb', respectively.
Figure 2B:
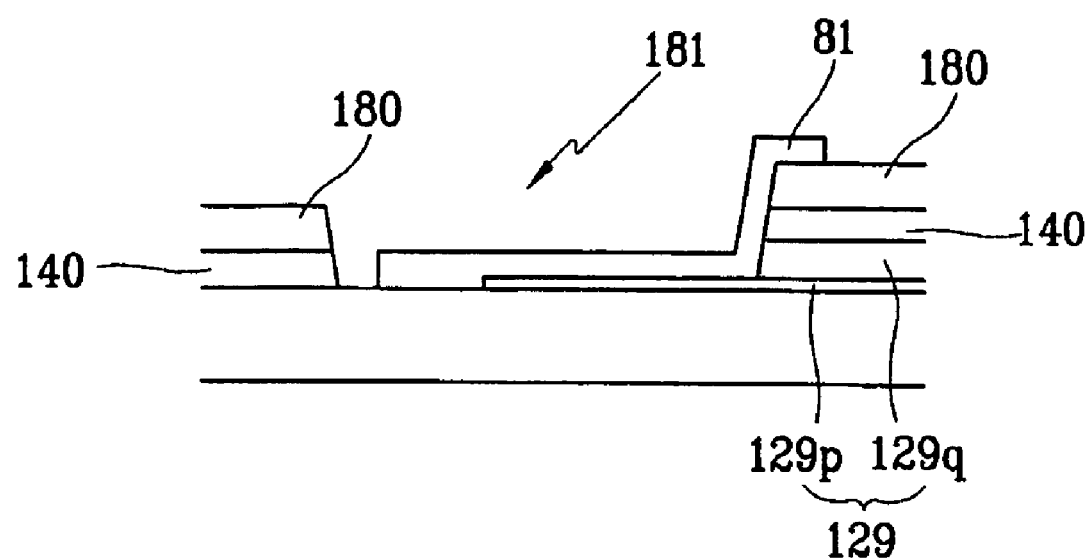

FIG. 1 is a layout view of a TFT array panel according to an embodiment of the present invention, and FIGS. 2A and 2B are sectional views of the TFT array panel shown in FIG. 1 taken along the lines IIa-IIa' and IIb-IIb', respectively.

A plurality of gate lines 121 for transmitting gate signals are formed on an insulating substrate 110. Each gate line 121 extends substantially in a transverse direction and it includes a plurality of portions projecting downward to form a plurality of gate electrodes 124 and an expanded end portion 129 having a large area for contact with another layer or an external device.

The gate lines 121 include two films having different physical characteristics, a lower film and an upper film. The upper film is preferably made of low resistivity metal including Al containing metal such as Al and Al alloy for reducing signal delay or voltage drop in the gate lines 121. On the other hand, the lower film is preferably made of material such as Mo containing metal such as Mo and Mo alloy, Cr, Ta and Ti, which has good physical, chemical, and electrical contact characteristics with other materials such as indium tin oxide (ITO) and indium zinc oxide (IZO). Good examples of combination of the lower film material and the upper film material are Cr and Al and Cr and Al—Nd alloy, which are etched under different etch conditions. In FIGS. 2A and 2B, the lower and the upper films of the gate electrodes 124 are indicated by reference numerals 124$p$ and 124$q$, respectively, and the lower and the upper films of the end portions 129 are indicated by reference numerals 129$p$ and 129$q$, respectively. Portions of the upper film 129$q$ of the end portions 129 of the gate lines 121 are removed to expose the underlying portions of the lower films 129$p$ and thus there is at least an edge of the upper film 129$q$ disposed on the lower film 129$p$.

However, the gate lines 121 may have a single layer or triple or more layers.

In addition, the lateral sides of the gate lines 121 are inclined relative to a surface of the substrate 110, and the inclination angle thereof ranges about 30-80 degrees.

A gate insulating layer 140 preferably made of silicon nitride (SiNx) is formed on the gate lines 121.

A plurality of semiconductor stripes 151 preferably made of hydrogenated amorphous silicon (abbreviated to "a-Si") are formed on the gate insulating layer 140. Each semiconductor stripe 151 extends substantially in the longitudinal direction and has a plurality of projections 154 branched out toward the gate electrodes 124.

A plurality of ohmic contact stripes and islands 161 and 165 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to a surface of the substrate 110, and the inclination angles thereof are preferably in a range of about 30-80 degrees.

A plurality of data lines 171 and a plurality of drain electrodes 175 are formed on the ohmic contacts 161 and 165.

The data lines 171 for transmitting data voltages extend substantially in the longitudinal direction and intersect the gate lines 121. Each data line 171 includes an expansion 179 having a larger area for contact with another layer or an external device.

A plurality of branches of each data line 171, which project toward the drain electrodes 175, form a plurality of source electrodes 173. Each drain electrode 175 includes one linear end portion disposed on a gate electrode 124 and partially enclosed by a source electrode 173 and the other expanded end portion having a large area for contact with another layer. A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The data lines 171 and the drain electrodes 175 also include a lower film 171$p$ and 175$p$ and an upper film 171$q$ and 175$q$ located thereon. Good examples of combination of the lower film material and the upper film material are Cr and Al and Cr and Al—Nd alloy, which are etched under different etch conditions. In FIGS. 2A and 2B, the lower and the upper films of the source electrodes 173 are indicated by reference numerals 173$p$ and 173$q$, respectively, and the lower and the upper films of the end portions 179 are indicated by reference numerals 179$p$ and 179$q$, respectively. Some portions of the lower film 173$p$ of the source electrodes 173 and some portions of the lower film 175$p$ of the linear end portions of the drain electrodes 175, which are disposed around the channels of the TFTs, are exposed. In addition, portions of the lower film 175$p$ of the expanded end portions of the drain electrodes 175 and portions of the lower film 179$p$ of the end portions 179 of the data lines 171 are also exposed and thus there is at least an edge of the upper film 175$q$/179$q$ disposed on the lower film 173$p$/179$p$.

Like the gate lines 121, the data lines 171 and the drain electrodes 175 have tapered lateral sides relative to a surface of the substrate 110, and the inclination angles thereof range about 30-80 degrees.

The ohmic contacts 161 and 165 are interposed only between the underlying semiconductor stripes 151 and the overlying data lines 171 and the overlying drain electrodes 175 thereon and reduce the contact resistance therebetween. The semiconductor stripes 151 have almost the same planar shapes as the data lines 171 and the drain electrodes 175 as well as the underlying ohmic contacts 161 and 165. However, the projections 154 of the semiconductor stripes 151 include a plurality of exposed portions, which are not covered with the data lines 171 and the drain electrodes 175, such as portions located between the source electrodes 173 and the drain electrodes 175.

A passivation layer 180 is formed on the data lines 171, the drain electrodes 175, and exposed portions of the semiconductor stripes 151, which are not covered with the data lines 171 and the drain electrodes 175. The passivation layer 180 is preferably made of photosensitive organic material having a good flatness characteristic, low dielectric insulating material such as a-Si:C:O and a-Si:O:F formed by plasma enhanced chemical vapor deposition (PECVD), or inorganic material such as silicon nitride and silicon oxide.

The passivation layer 180 has a plurality of contact holes 182 and 185 exposing the end portions 179 of the data lines 171 and the drain electrodes 175, respectively. The passivation layer 180 and the gate insulating layer 140 have a plurality of contact holes 181 exposing the end portions 129 of the gate lines 121. Furthermore, the passivation layer 180 has a plurality of openings 189 exposing the exposed portions of the projections 154 of the semiconductor stripes 151 in the TFTs and the exposed portions of the lower films 173p and 175p disposed around the exposed portions of the projections 154.

The contact holes 181, 182 and 185 expose the lower films 129p, 179p and 175p. The edges of the upper films 129q, 179q and 175q disposed on the lower films 129p, 179p and 175p substantially coincide with boundaries of the contact holes 181, 182 and 185 and the openings 189. In addition, the contact holes 181 expose edges of the end portions 129 of the gate lines 121 and some portions of the substrate 110, and the contact holes 182/185 expose edges of the end portions 179 of the data lines 171/the drain electrodes 175 and some portions of the gate insulating layer 140.

A plurality of pixel electrodes 190, a plurality of redundant source electrodes 193 and redundant drain electrodes 195, and a plurality of contact assistants 81 and 82, which are preferably made of IZO, are formed on the passivation layer 180.

The pixel electrodes 190 are physically and electrically connected to the drain electrodes 175 through the contact holes 185 such that the pixel electrodes 190 receive the data voltages from the drain electrodes 175. The pixel electrodes 190 fully cover the exposed portions of the drain electrodes 175.

The pixel electrodes 190 supplied with the data voltages generate electric fields in cooperation with a common electrode (not shown) on another panel (not shown), which reorient liquid crystal molecules in a liquid crystal layer (not shown) disposed therebetween.

A pixel electrode 190 and a common electrode form a liquid crystal capacitor, which stores applied voltages after turn-off of the TFT. An additional capacitor called a "storage capacitor," which is connected in parallel to the liquid crystal capacitor, may be provided for enhancing the voltage storing capacity. The storage capacitors are implemented by overlapping the pixel electrodes 190 with the gate lines 121 adjacent thereto (called "previous gate lines") or with separately provided storage electrodes (not shown). The capacitances of the storage capacitors, i.e., the storage capacitances are increased by increasing overlapping areas or by providing conductors, which are connected to the pixel electrodes 190 and overlap the gate lines 121 or the storage electrodes, under the pixel electrodes 190 for decreasing the distance between the terminals.

The pixel electrodes 190 may overlap the gate lines 121 and the data lines 171 to increase aperture ratio.

The redundant source electrodes 193 and the redundant drain electrodes 195 are disposed on the source and the drain electrodes 173 and 175, respectively and they contact the exposed portions of the lower films 173p and 175p of the source and the drain electrodes 173 and 175 through the openings 189. The redundant electrodes 193 and 195 cover the exposed portions of the lower films 173p and 175p of the source and the drain electrodes 173 and 175 in the openings 189 and they have inner edges that face each other and coincide with the edges of the lower films 173p and 175p.

The contact assistants 81/82 are connected to the exposed expansions 129/179 of the gate lines 121/the data lines 171 through the contact holes 181/182 and the contact assistants 81 and 82 fully cover the exposed expansions 129 and 179.

The contact assistants 81 and 82 protect the exposed portions 129 and 179 and complement the adhesion between the exposed portions 129 and 179 and external devices.

In the meantime, the exposure of the edges of the lower films 129p, 179p and 175p of the end portions 129 of the gate lines 121, the end portions 179 of the data lines 171, and the expanded end portions of the drain electrodes 175 through the contact holes 181, 182 and 185 prevents the disconnection of the contact assistants 81 and 82 and the pixel electrodes 190 at the contact holes 181, 182 and 185. For example, portions of the pixel electrodes 190 near an edge of the contact hole 185 disposed on the lower film 175p may be disconnected due to the undercut of the upper film 175q at the edge of the contact hole 185. The undercut means that a portion of the upper film 175q under the passivation layer 180 at the edge of the contact hole 185 is removed to place the boundary of the upper film 175q under the passivation layer 180 such that the sidewall of the contact hole 185 has a hole or a depression as shown in FIG. 2A. However, the other edge of the contact hole 185 disposed directly on the gate insulating layer 140 does not have such undercut. Accordingly, the pixel electrodes 190 contact the drain electrodes 175 with a smooth profile, thereby securing the reliable contact therebetween.

A light blocking member 220 preferably made of photosensitive organic material including black pigment, Cr, or Cr oxide is formed on the exposed portions of the semiconductor stripes 151 and on the passivation layer 180. The light blocking member 220 blocks light leakage between the pixel electrodes 190 and has a plurality of openings exposing the pixel electrodes 190 and it protects the exposed portions of the semiconductor stripes 151. The light blocking member 220 may further include an inorganic insulator such as silicon nitride or silicon oxide in contact with the exposed portions of the semiconductor stripes 151.

The pixel electrodes 190 may be made of ITO or transparent conductive polymer. For a reflective LCD, the pixel electrodes 190 are made of opaque reflective metal. In these cases, the contact assistants 81 and 82 may be made of material such as ITO or IZO different from the pixel electrodes 190.

A method of manufacturing the TFT array panel shown in FIGS. 1, 2A and 2B according to an embodiment of the present invention will be now described in detail with reference to FIGS. 3 to 12B as well as FIGS. 1, 2A and 2B.

Figure 3:
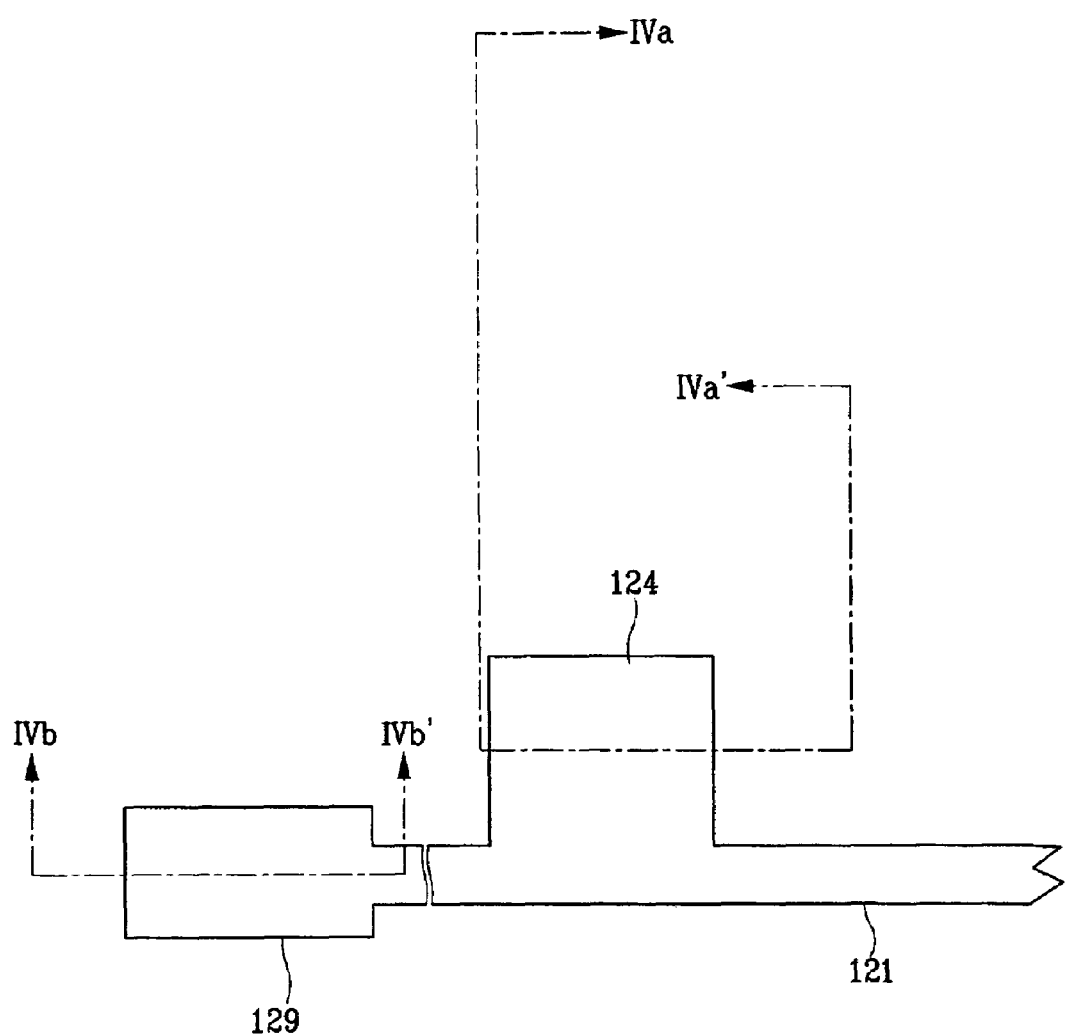
FIG. 3 is a layout view of a TFT array panel shown in FIGS. 1, 2A and 2B in the first step of a manufacturing method thereof according to an embodiment of the present invention.
Figure 4B:
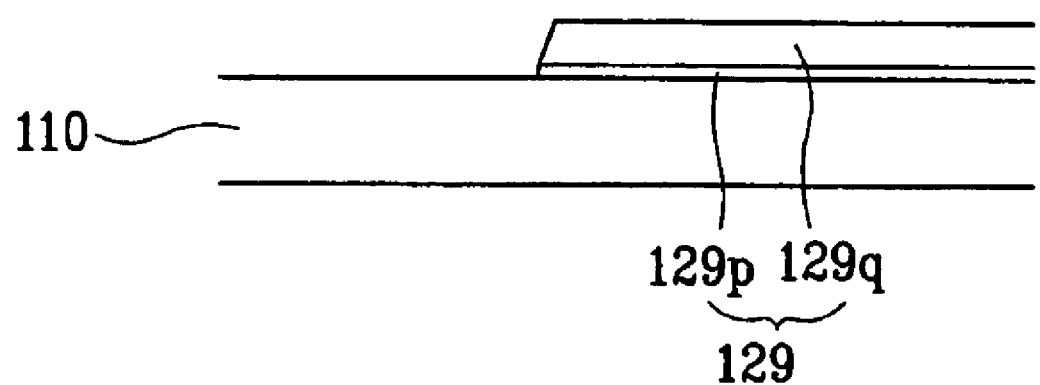
Figure 5:
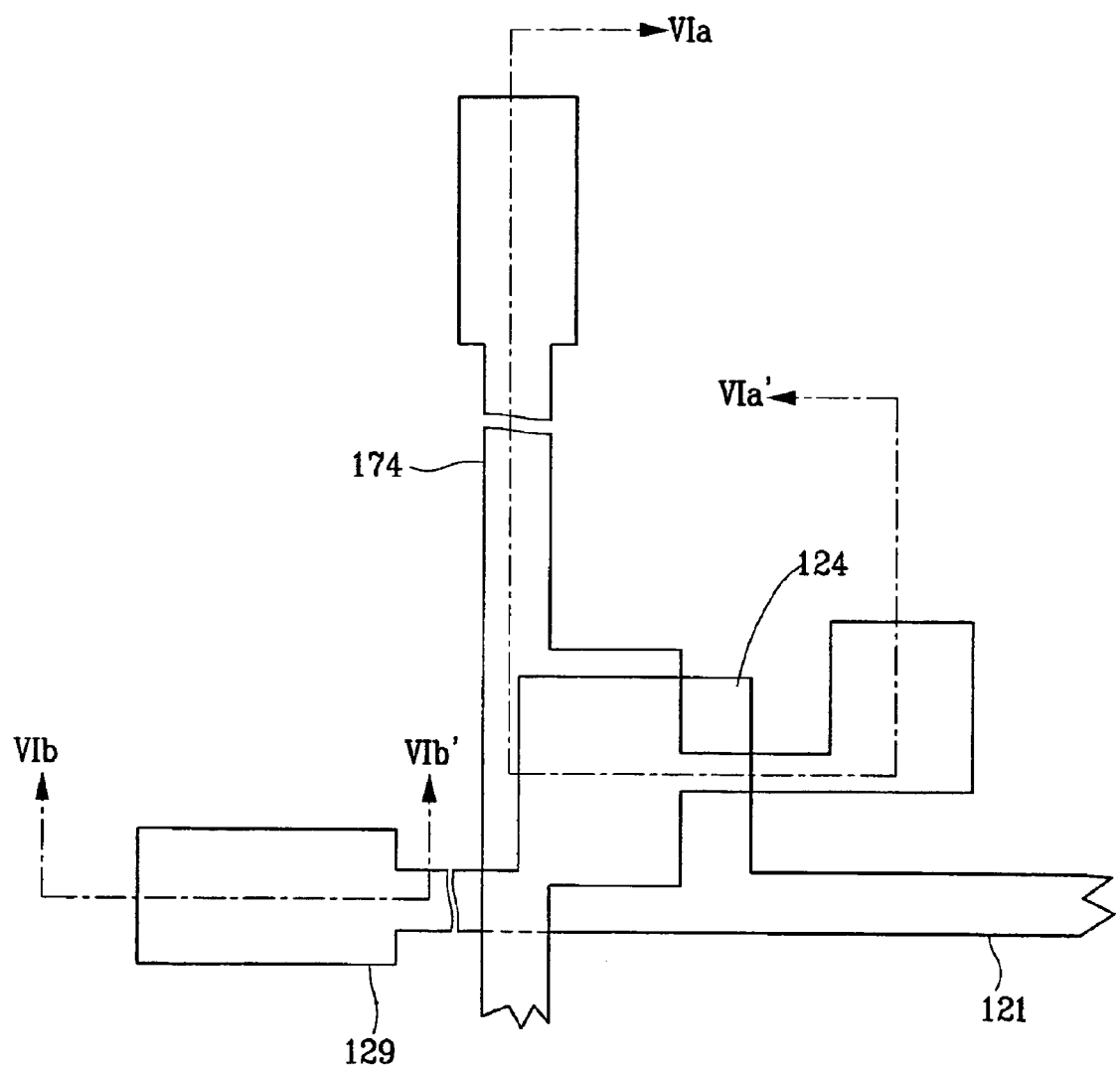
FIG. 5 is a layout view of the TFT array panel in the step following the step shown in FIGS. 3-4B.
Figure 6B:
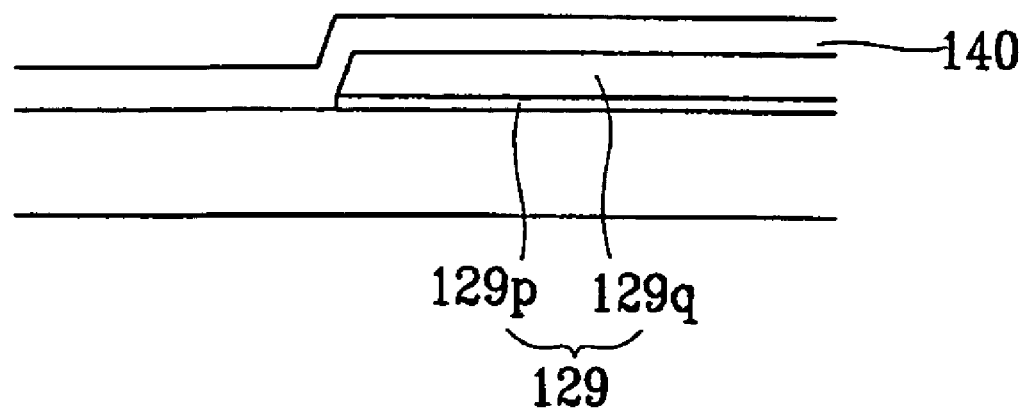
Figure 7:
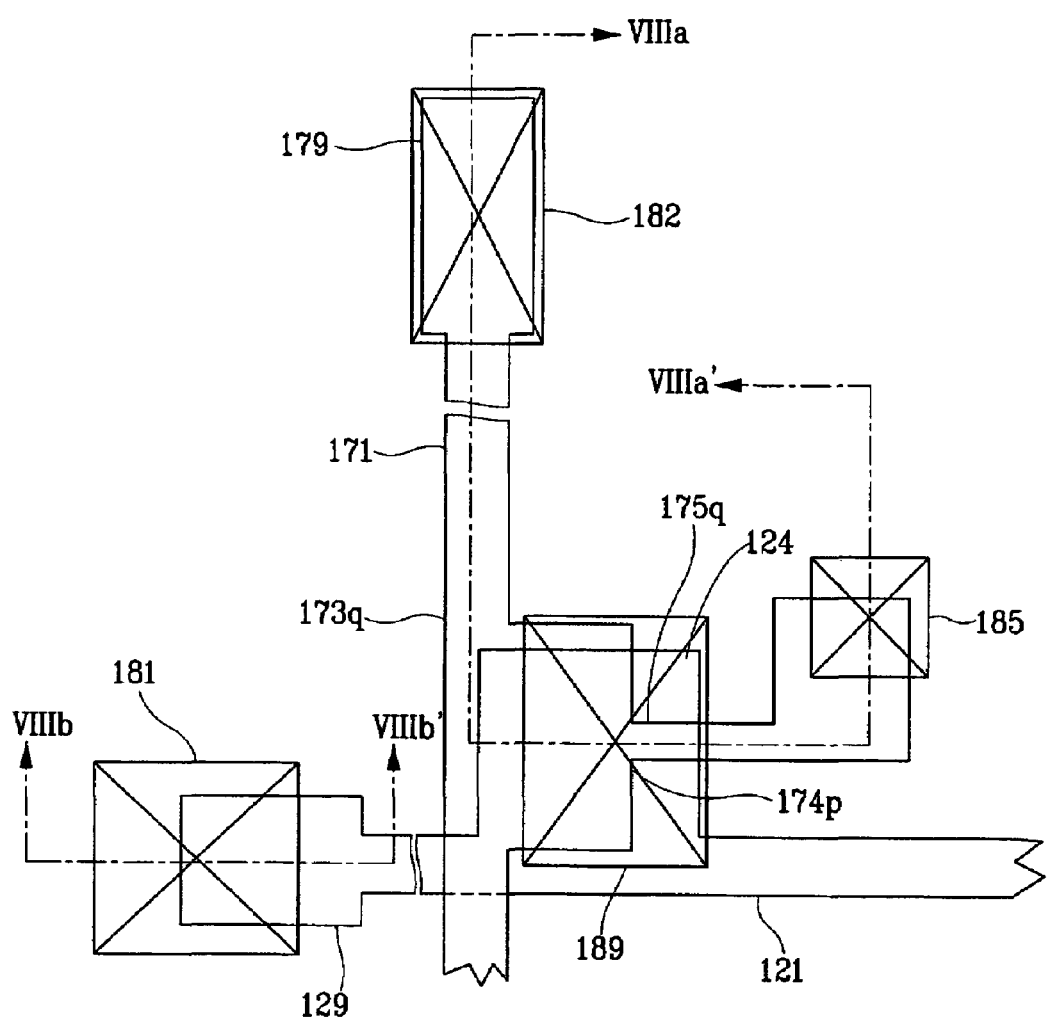
FIG. 7 is a layout view of the TFT array panel in the step following the step shown in FIGS. 5-6B.
Figure 8A:
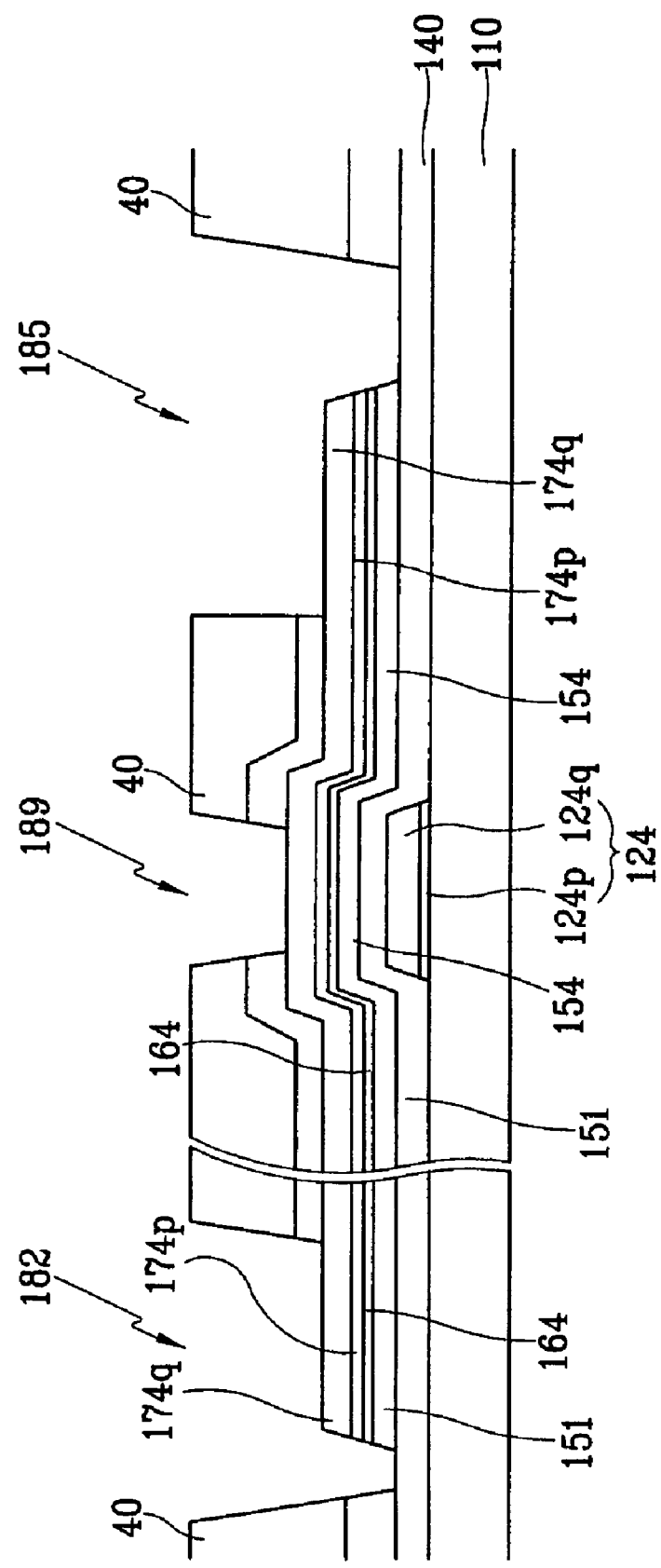
FIGS. 8A and 8B are sectional views of the TFT array panel shown in FIG. 7 taken along the lines VIIIa-VIIIa' and VIIIb-VIIIb', respectively.
Figure 8B:
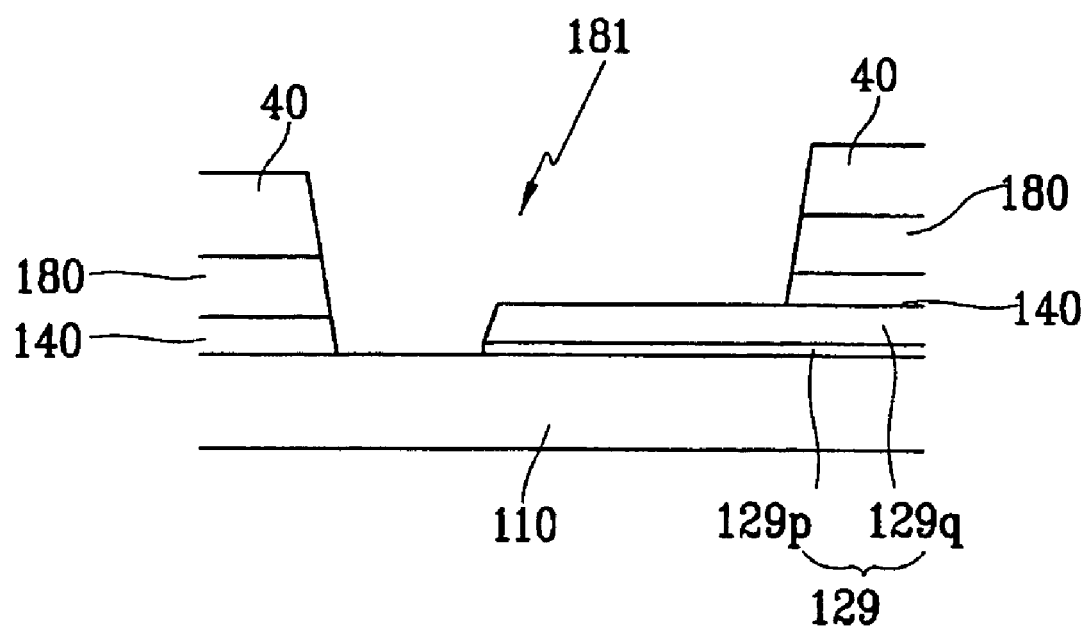
Figure 9A:
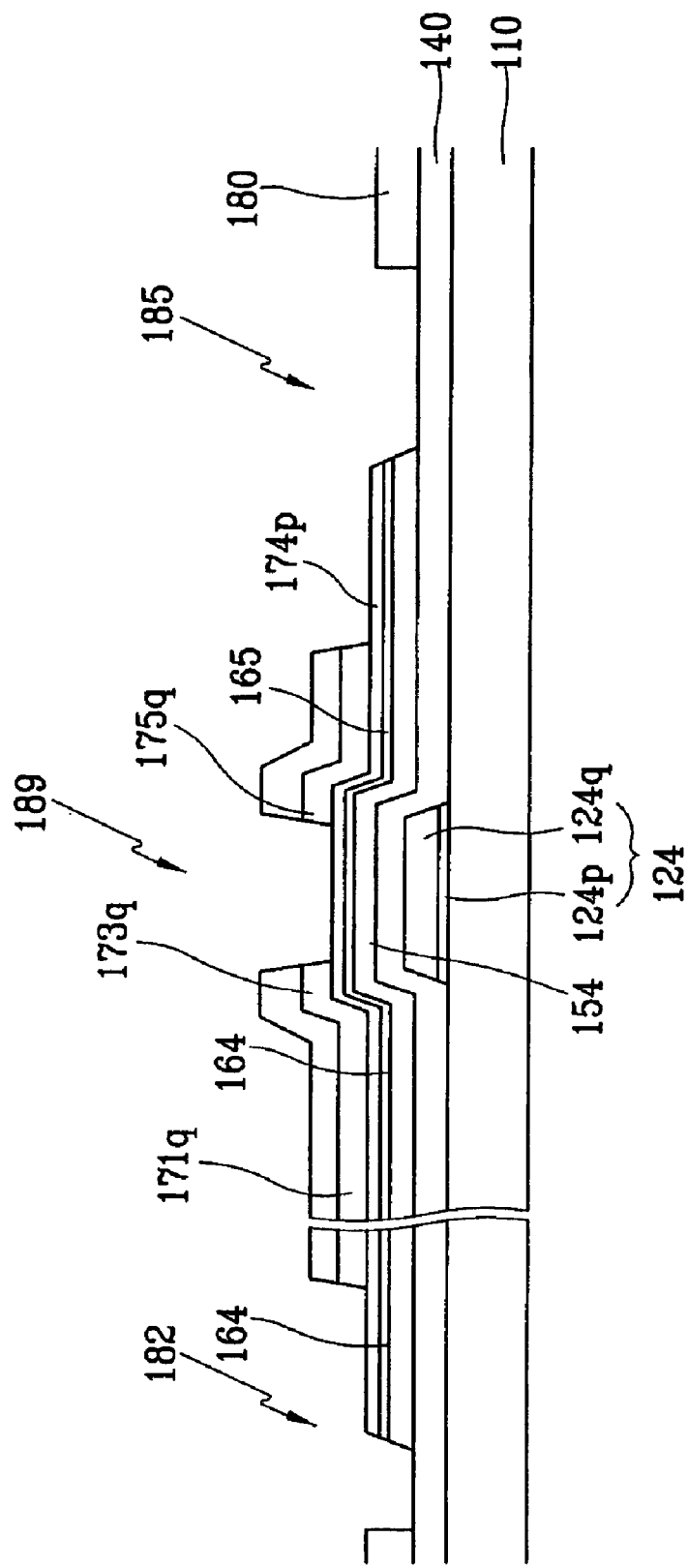
FIGS. 9A and 9B are sectional views of the TFT array panel shown in FIG. 7 taken along the lines VIIIa-VIIIa' and VIIIb-VIIIb', respectively, and illustrate the step following the step shown in FIGS. 8A and 8B.
Figure 9B:
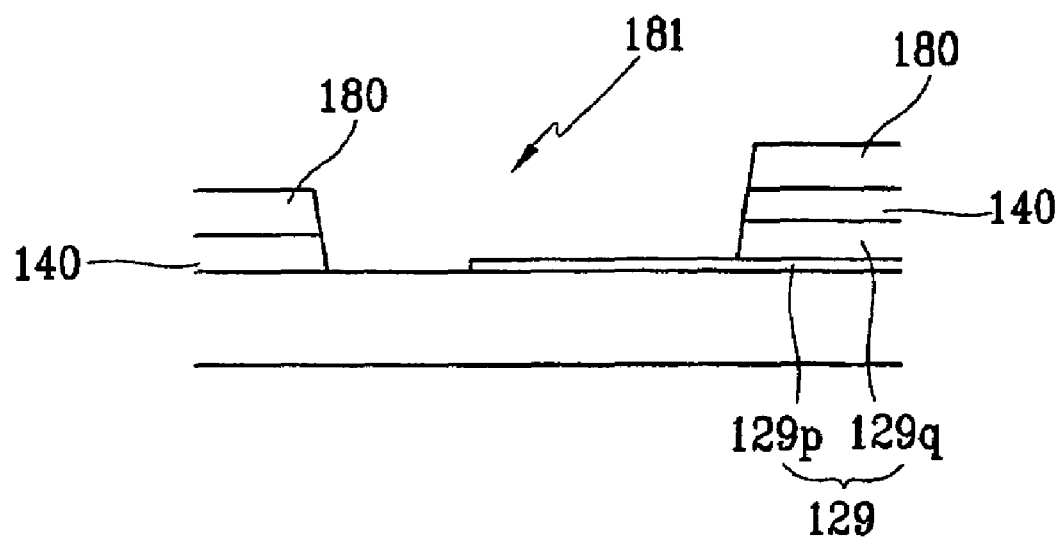
Figure 10:
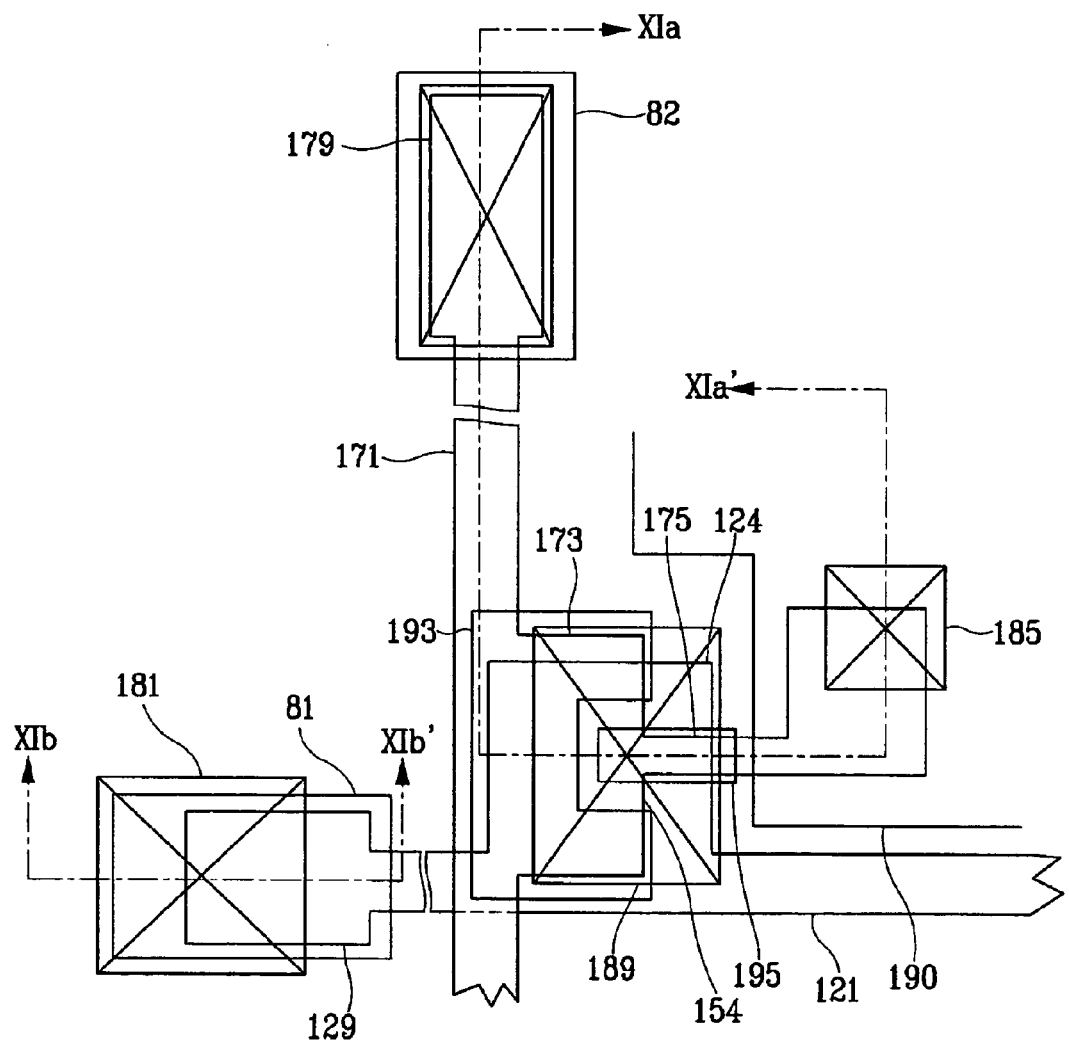
FIG. 10 is a layout view of the TFT array panel in the step following the step shown in FIGS. 9A and 9B.
Figure 11A:
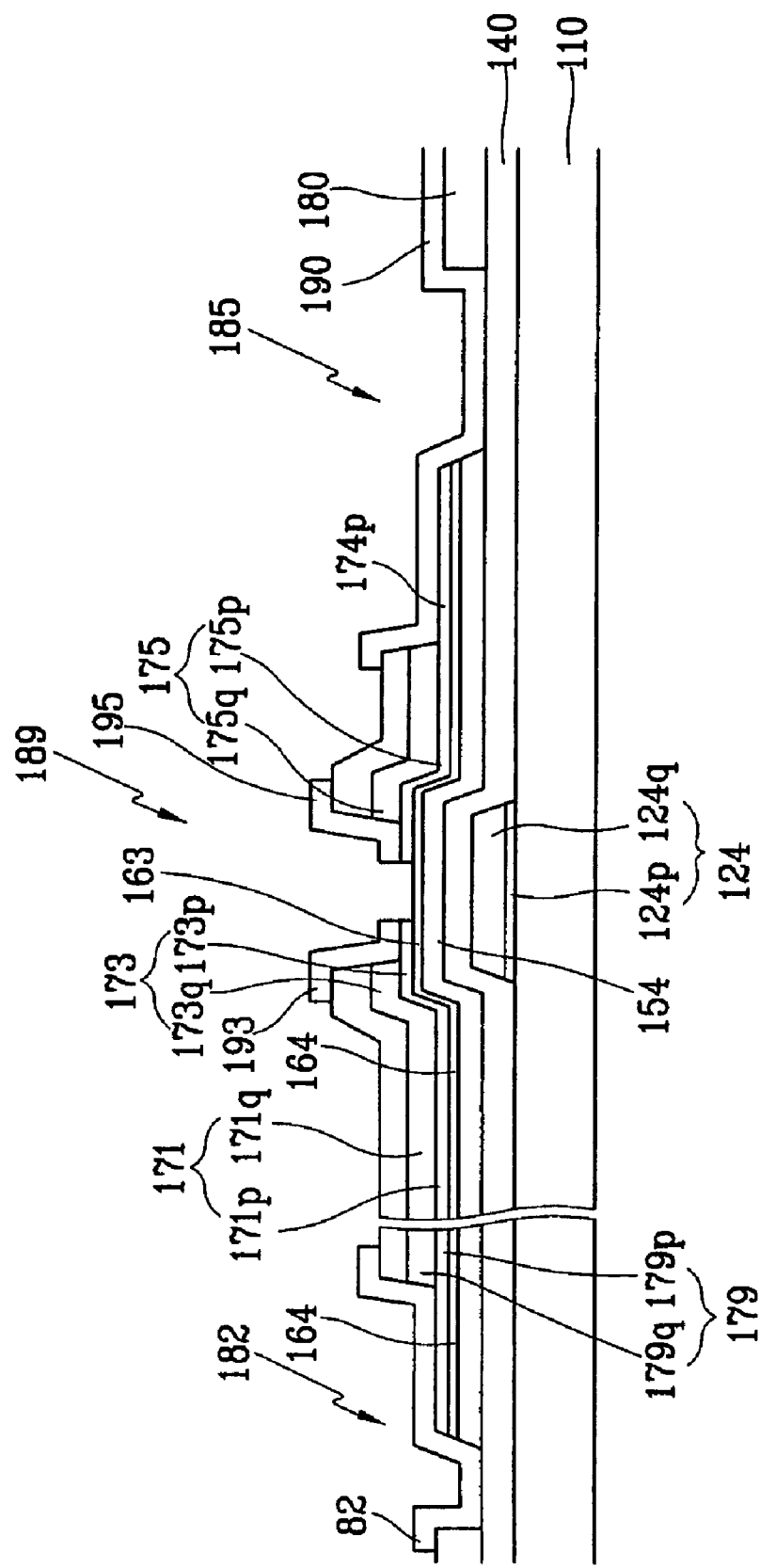
FIGS. 11A and 11B are sectional views of the TFT array panel shown in FIG. 10 taken along the lines XIa-XIa' and XIb-XIb', respectively.
Figure 11B:
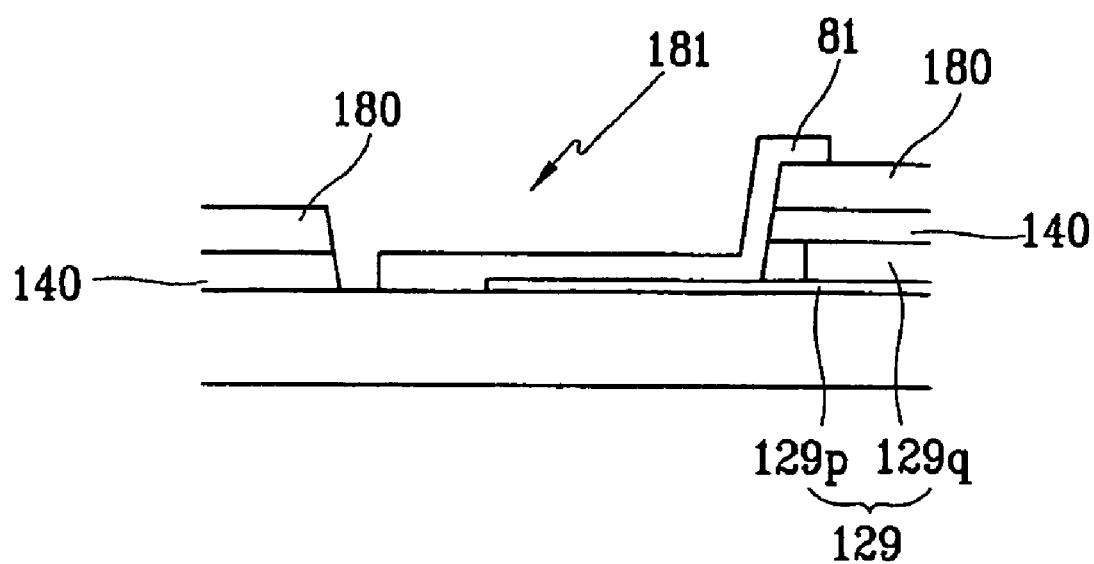
Figure 12A:
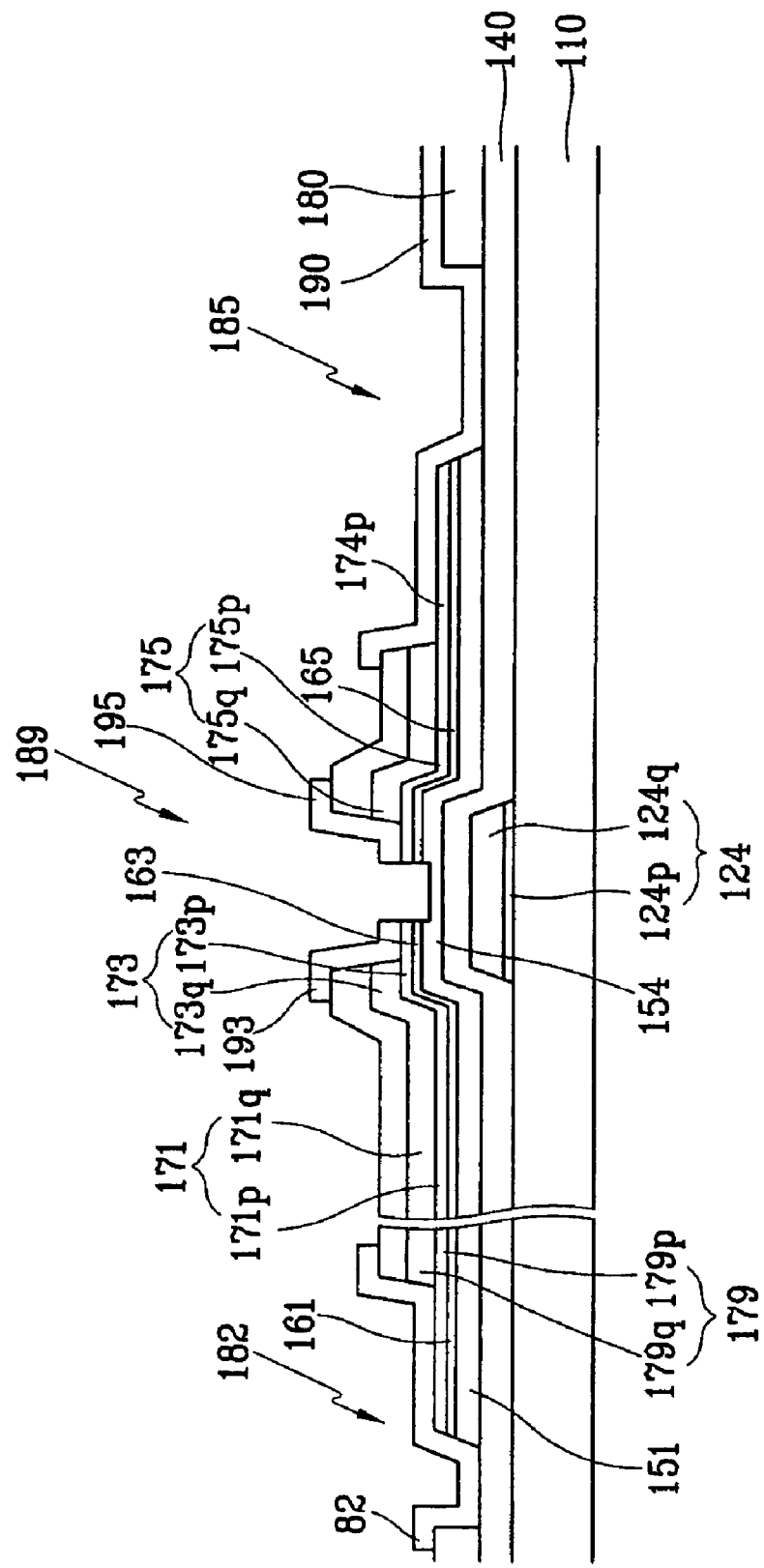
FIGS. 12A and 12B are sectional views of the TFT array panel shown in FIG. 10 taken along the lines XIa-XIa' and XIb-XIb', respectively, and illustrate the step following the step shown in FIGS. 11A and 11B.
Figure 12B:
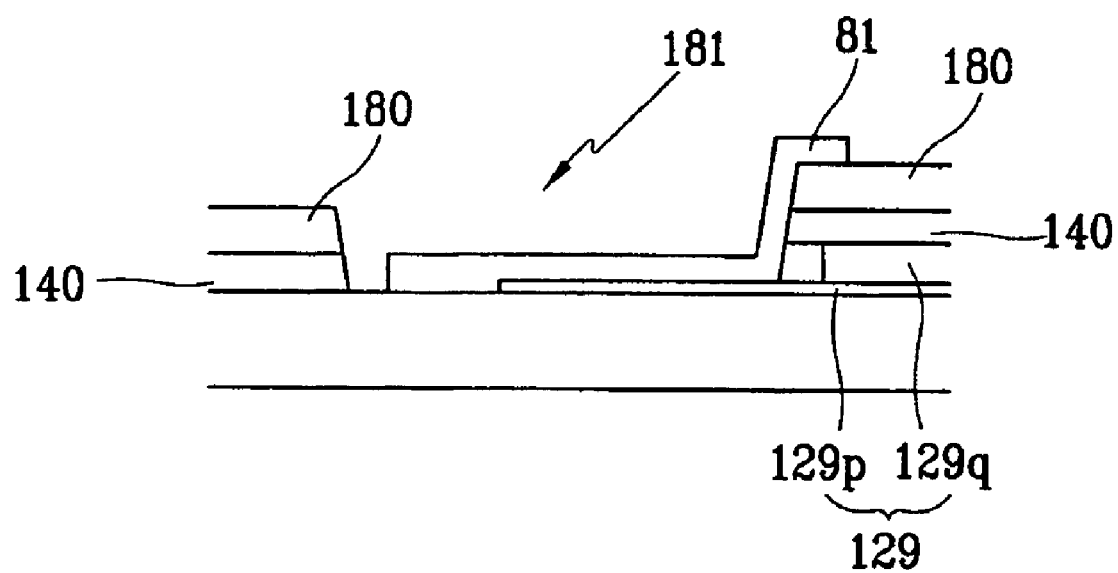

FIG. 3 is a layout view of a TFT array panel shown in FIGS. 1, 2A and 2B in the first step of a manufacturing method thereof according to an embodiment of the present invention; FIGS. 4A and 4B are sectional views of the TFT array panel shown in FIG. 3 taken along the lines IVa-IVa' and IVb-IVb', respectively; FIG. 5 is a layout view of the TFT array panel in the step following the step shown in FIGS. 3-4B; FIGS. 6A and 6B are sectional views of the TFT array panel shown in FIG. 5 taken along the lines VIa-VIa' and VIb-VIb', respectively; FIG. 7 is a layout view of the TFT array panel in the step following the step shown in FIGS. 5-6B; FIGS. 8A and 8B are sectional views of the TFT array panel shown in FIG. 7 taken along the lines VIIIa-VIIIa' and VIIIb-VIIIb', respectively; FIGS. 9A and 9B are sectional views of the TFT array panel shown in FIG. 7 taken along the lines VIIIa-VIIIa' and VIIIb-VIIIb', respectively, and illustrate the step following the step shown in FIGS. 8A and 8B; FIG. 10 is a layout view of the TFT array panel in the step following the step shown in FIGS. 9A and 9B; FIGS. 11A and 11B are sectional views of the TFT array panel shown in FIG. 10 taken along the lines XIa-XIa' and XIb-XIb', respectively; and FIGS. 12A and 12B are sectional views of the TFT array panel shown in FIG. 10 taken along the lines XIa-XIa' and XIb-XIb', respectively, and illustrate the step following the step shown in FIGS. 11A and 11B.

Referring to FIGS. 3-4B, a plurality of gate lines 121 including a plurality of gate electrodes 124 are formed on an insulating substrate 110 such as transparent glass. The gate lines 121 include two conductive films, a lower conductive film preferably made of Cr and having a thickness of about 500 Å and an upper conductive film preferably made of Al and having a thickness of about 1,000-3,000 Å, preferably about 2,500 Å.

Referring to FIGS. 5-6B, a gate insulating layer 140, an intrinsic a-Si layer, an extrinsic a-Si layer, and a conductive layer including a lower conductive film and an upper conductive film are deposited in sequence by CVD and sputtering and the conductive layer, the extrinsic a-Si layer, and the intrinsic a-Si layer are photo-etched to form a plurality of conductors 174 including upper and lower conductors 174q and 174p, a plurality of extrinsic semiconductor stripes 164, and a plurality of intrinsic semiconductor stripes 151 including a plurality of projections 154 on the gate insulating layer 140.

The gate insulating layer 140 is preferably made of silicon nitride with thickness of about 2,000 Å to about 5,000 Å, and the deposition temperature is preferably in a range of about 250-500° C. The intrinsic a-Si layer and the extrinsic a-Si layer have thickness of about 500-600 Å. The lower conductive film is preferably made of Cr and has a thickness of about 500 Å and the upper conductive film is preferably made of Al and has a thickness of about 1,000-3,000 Å, preferably about 2,500 Å. A sputtering target for the upper conductive film is preferably Al or Al—Nd containing about 2 atomic % of Nd and a sputtering temperature is about 150° C.

Referring to FIGS. 7-9B, a passivation layer 180 preferably having a thickness larger than about 3,000 Å is deposited and a photoresist 40 is formed. The passivation layer 180 and the gate insulating layer 140 are etched using the photoresist 40 as an etch mask to form a plurality of contact holes 181, 182 and 185 and a plurality of openings 189.

In detail, the photoresist 40 initially has a position dependent thickness such that portions (not shown) on the contact holes 182 and 185 and the openings 189 have smaller thickness than other portions, and there is substantially no photoresist on the contact holes 181. Portions of the passivation layer 180 and the gate insulating layer 140, which are not covered with the photoresist 40, are removed to form the contact holes 181 exposing the upper film 129q of the end portions 129 of the gate lines 121 and the upper conductors 174q. At this time, the portions of the photoresist 40 having the smaller thickness prevent portions of the gate insulating layer 140 disposed in the contact holes 182 and 185 and the openings 189 from being removed so that the portions of the gate insulating layer 140 near the edges of the conductors 174 may not be overcut. Thereafter, portions of the photoresist 40 on the contact holes 182, 185 and the openings 189 are removed to expose underlying portions of the passivation layer 180 and the exposed portions of the passivation layer 180 are removed to form the contact holes 182, 185 and the openings 189 as shown in FIGS. 8A and 8B. After or before removing the photoresist 40, the exposed portions of the upper conductors 174q and the upper film 129q are removed to expose the lower conductors 174p and the lower film 129p and to complete the upper films 171q and 175q of the end portions 179 and the drain electrodes 175 as shown in FIGS. 9A and 9B. The etch condition for etching the upper conductors 174q and the upper film 129q is determined so that the lower conductors 174p and the lower film 129p may not be etched. At this time, the undercut of the upper conductors 174q and the upper film 129q may be formed as shown in FIGS. 9A and 9B.

Referring to FIGS. 10-11B, an IZO layer having a thickness of about 400-500 Å is sputtered and photo-etched to form a plurality of pixel electrodes 190, a plurality of redundant source electrodes 193 and redundant drain electrodes 195, and a plurality of contact assistants 81 and 82. An example of commercially available sputtering target for IZO is IDIXO (indium x-metal oxide) produced by Idemitsu in Japan. The sputtering target may include $In_2O_3$ and ZnO and the content of Zn among In and Zn preferably ranges about 15-20 atomic %. In addition, the sputtering temperature for Zn is preferably lower than about 250° C. and IZO can be etched by oxalic acid.

The contact assistants 81 and 82, the redundant electrodes 193 and 195, and the pixel electrodes 190 cover the exposed portions of the lower conductors 129p exposed through the contact holes 181, the exposed portions of the lower conductors 174p exposed through the contact holes 182, the exposed portions of the gate insulating layer 140 exposed through the contact holes 182 and 185 and the openings 189, and some of the exposed portions of the lower conductors 174p exposed through the openings 189. However, the other of the exposed portions of the lower conductors 174p exposed through the openings 189 are not covered yet. The exposed portions of the lower conductors 174p are removed by blanket etch to expose the extrinsic semiconductor stripes 164 and to complete the lower films 171p and 175p of the data lines 171 and the drain electrodes 175. The IZO layer and the exposed portions of the lower conductors 174p are simultaneously removable by using a Cr etchant. The redundant electrodes 193 and 195 facilitate the control of the length and the width of TFTs.

Referring to FIGS. 12A and 12B, the exposed portions of the extrinsic semiconductor stripes 164, which are not covered with the data lines 171 and the drain electrodes 175, are removed by blanket etch to complete a plurality of ohmic contact stripes 161 including a plurality of projections 163 and a plurality of ohmic contact islands 165 and to expose portions of the intrinsic semiconductor stripes 151.

Oxygen plasma treatment may follow thereafter in order to stabilize the exposed surfaces of the semiconductor stripes 151.

Finally, a light blocking member 220 preferably made of organic insulator including black pigment or Cr—CrOx is formed on the exposed portions of the semiconductor stripes 151 as shown in FIGS. 1-2B. The light blocking member 220 may be made of photosensitive material and this can simplify the process since the thickness of the photosensitive film can be adjusted by controlling rotational speed of a spin coating device.

The above-described method uses only a mask for forming the data lines 171 having a double-layered structure including an Al film, thereby reducing the number of photolithography steps. Accordingly, the manufacturing method is simplified to reduce the production cost and the productivity.

In addition, the provision of the light blocking member 220 enables to omit that on a common electrode panel facing the TFT array panel and thus the alignment error margin of the light blocking member 220 is reduced to increase the aperture ratio.

A TFT array panel for an LCD according to another embodiment of the present invention will be described in detail with reference to FIGS. 13 and 14.

Figure 13:
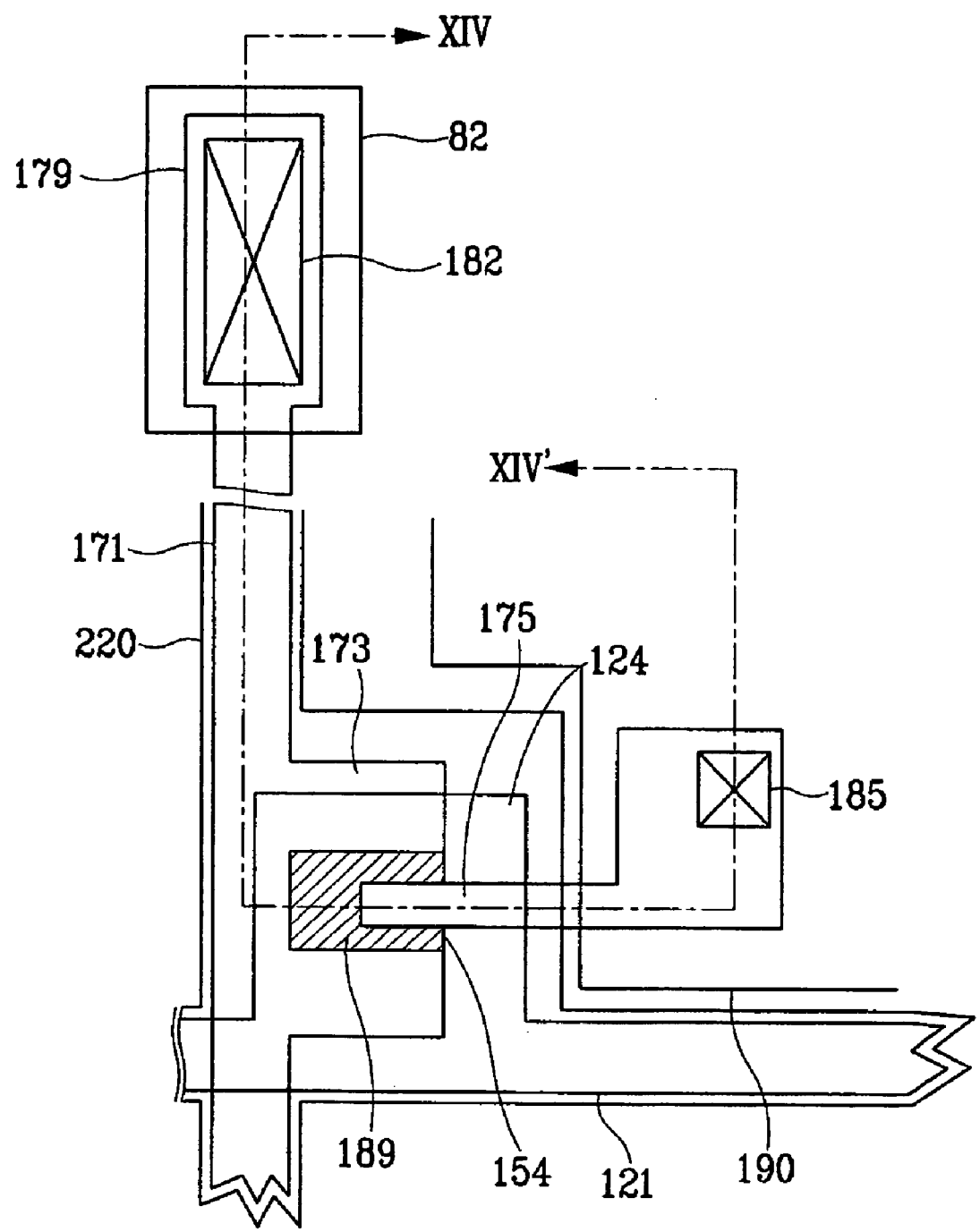
FIG. 13 is a layout view of a TFT array panel for an LCD according to another embodiment of the present invention.
Figure 14:
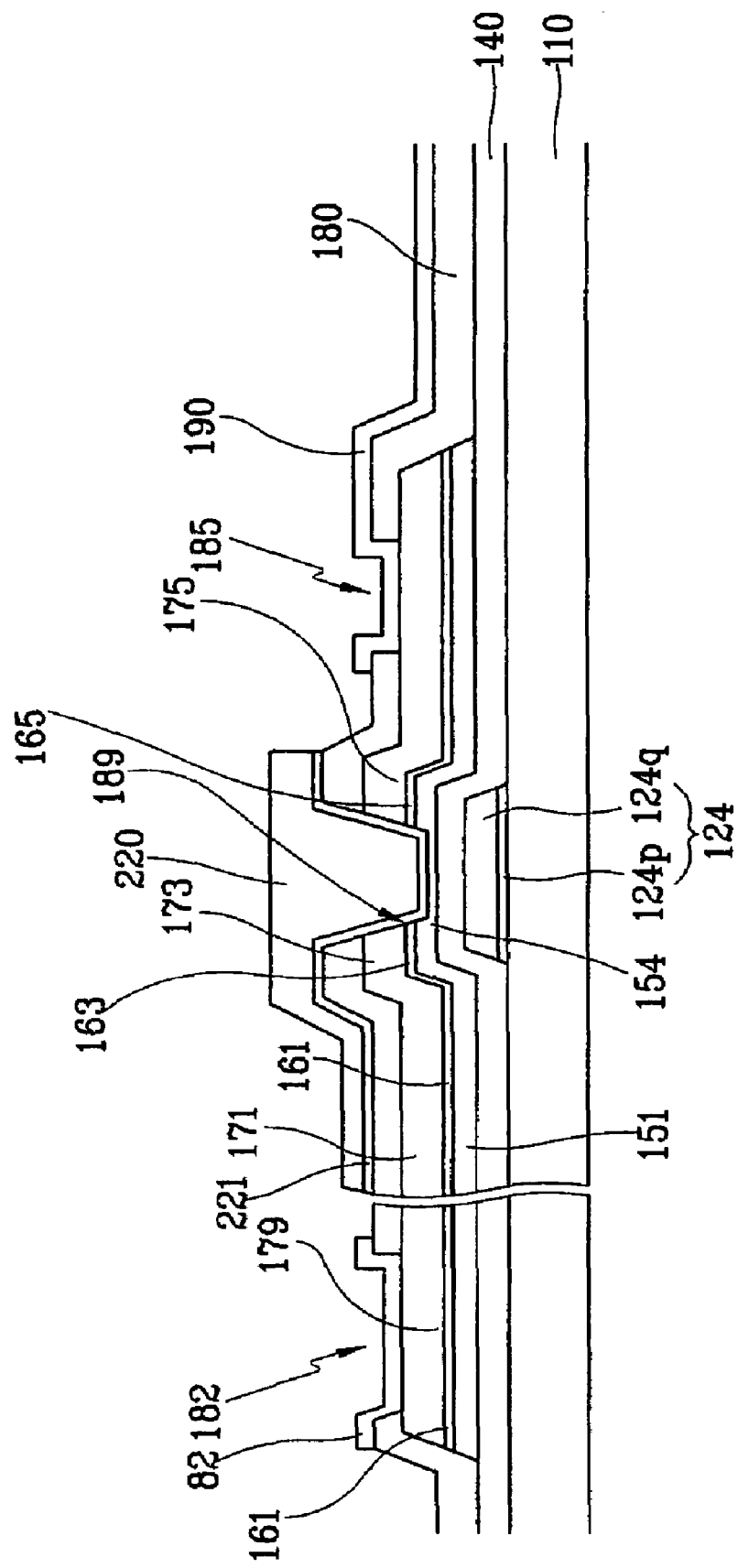
FIG. 14 is a sectional view of the TFT array panel shown in FIG. 13 taken along the line XIV-XIV'.

FIG. 13 is a layout view of a TFT array panel for an LCD according to another embodiment of the present invention and FIG. 14 is a sectional view of the TFT array panel shown in FIG. 13 taken along the line XIV-XIV'.

Referring to FIGS. 13 and 14, a layered structure of the TFT array panel according to this embodiment is almost the same as those shown in FIGS. 1-2B.

That is, a plurality of gate lines 121 including gate electrodes 124 are formed on a substrate 110, and a gate insulating layer 140, a plurality of semiconductor stripes 151 including projections 154, and a plurality of ohmic contact stripes 161 including projections 163 and a plurality of ohmic contact islands 165 are sequentially formed thereon. A plurality of data lines 171 including source electrodes 173 and a plurality of drain electrodes 175 are formed on the ohmic contacts 161 and 165, and a passivation layer 180 are formed thereon. A plurality of contact holes 182 and 185 and a plurality of openings 189 are provided at the passivation layer 180 and the gate insulating layer 140, and a plurality of pixel electrodes 190 and a plurality of contact assistants 82 are formed on the passivation layer 180. A light blocking member 220 is formed on the openings 189.

Different from the TFT array panel shown in FIGS. 1-2B, the data lines 171 and the drain electrodes 175 include only a single film preferably made of Cr.

In addition, the gate lines 121 have no expanded end portion, the passivation layer 180 has no contact hole on the gate lines 121, and there is no contact assistant on the gate lines 121. Instead, the gate lines 121 may be directly connected to a gate driver (not shown) that may be integrated on the substrate 110.

Moreover, the contact holes 182 and 185 do not expose edges of the end portions 179 of the data lines 171 and the drain electrodes 175.

Furthermore, the TFT array panel has no redundant source electrode and no redundant drain electrode and the openings 189 have edges coinciding with edges of the source and the drain electrodes 173 and 175.

The TFT array panel further includes an insulating layer 221 preferably made of silicon nitride or silicon oxide and disposed under the passivation layer 180.

Many of the above-described features of the TFT array panel for an LCD shown in FIGS. 1-2B may be appropriate to the TFT array panel shown in FIGS. 13 and 14.

A method of manufacturing the TFT array panel shown in FIGS. 13 and 14 according to an embodiment of the present invention will be now described in detail with reference to FIGS. 15-23 as well as FIGS. 13 and 14.

Figure 15:
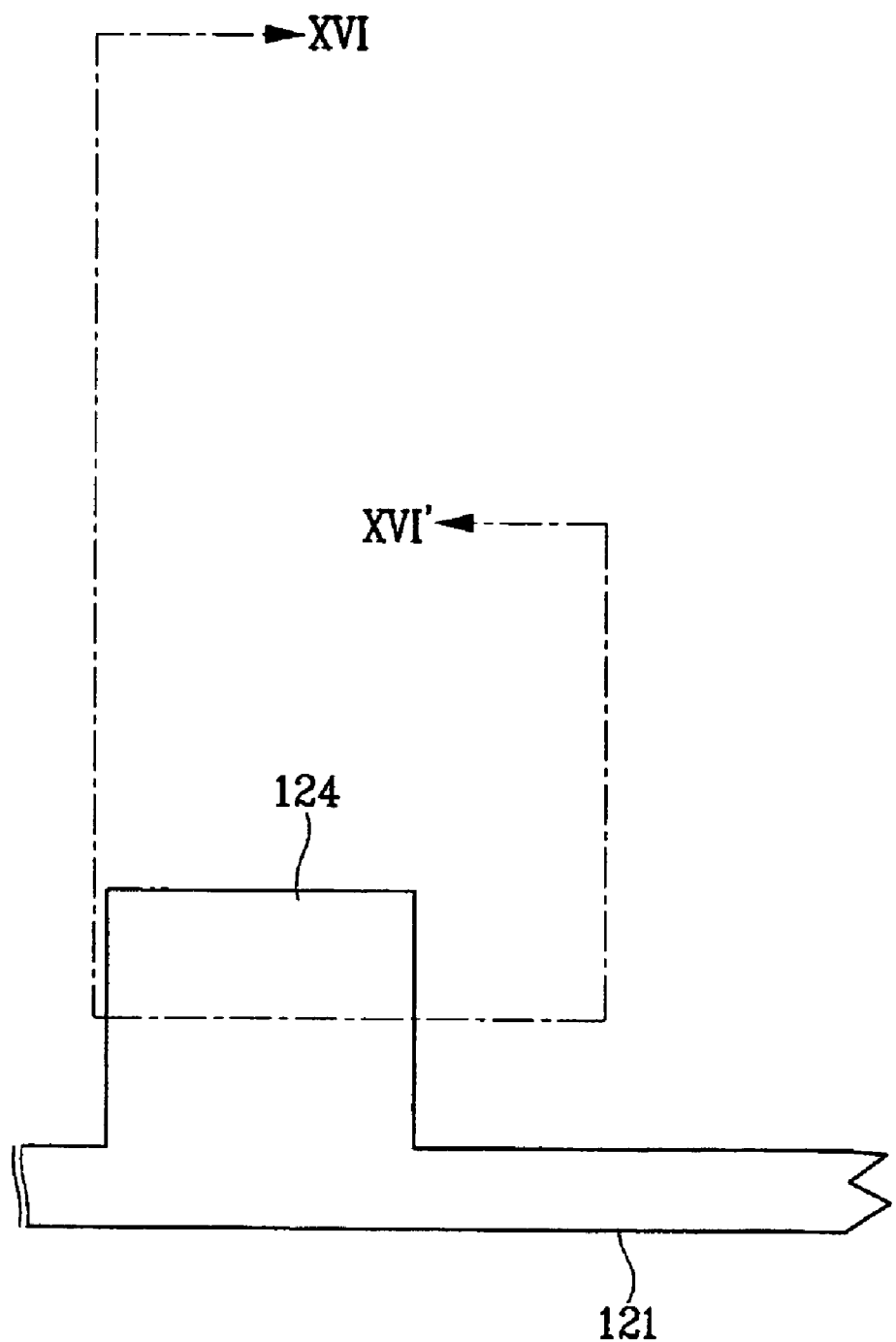
FIG. 15 is a layout view of a TFT array panel shown in FIGS. 13 and 14 in the first step of a manufacturing method thereof according to an embodiment of the present invention.
Figure 16:
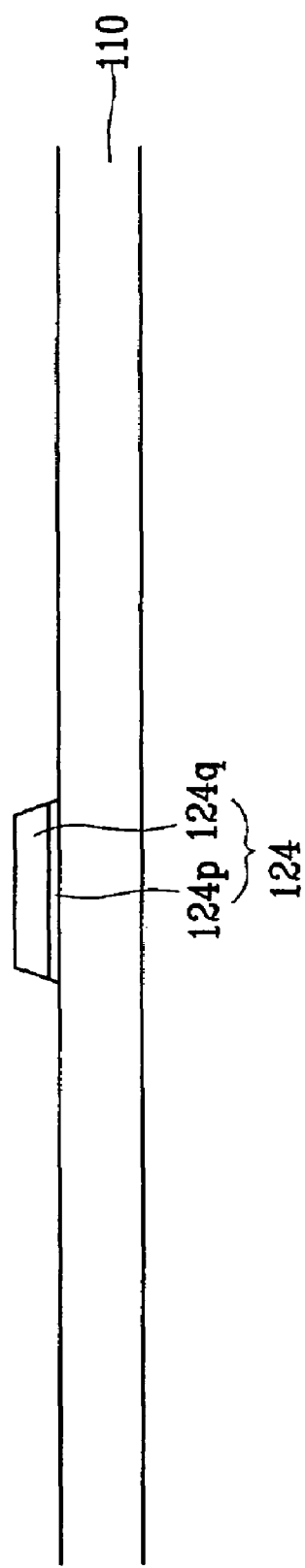
FIG. 16 is a sectional view of the TFT array panel shown in FIG. 15 taken along the lines XVI-XVI'.
Figure 17:
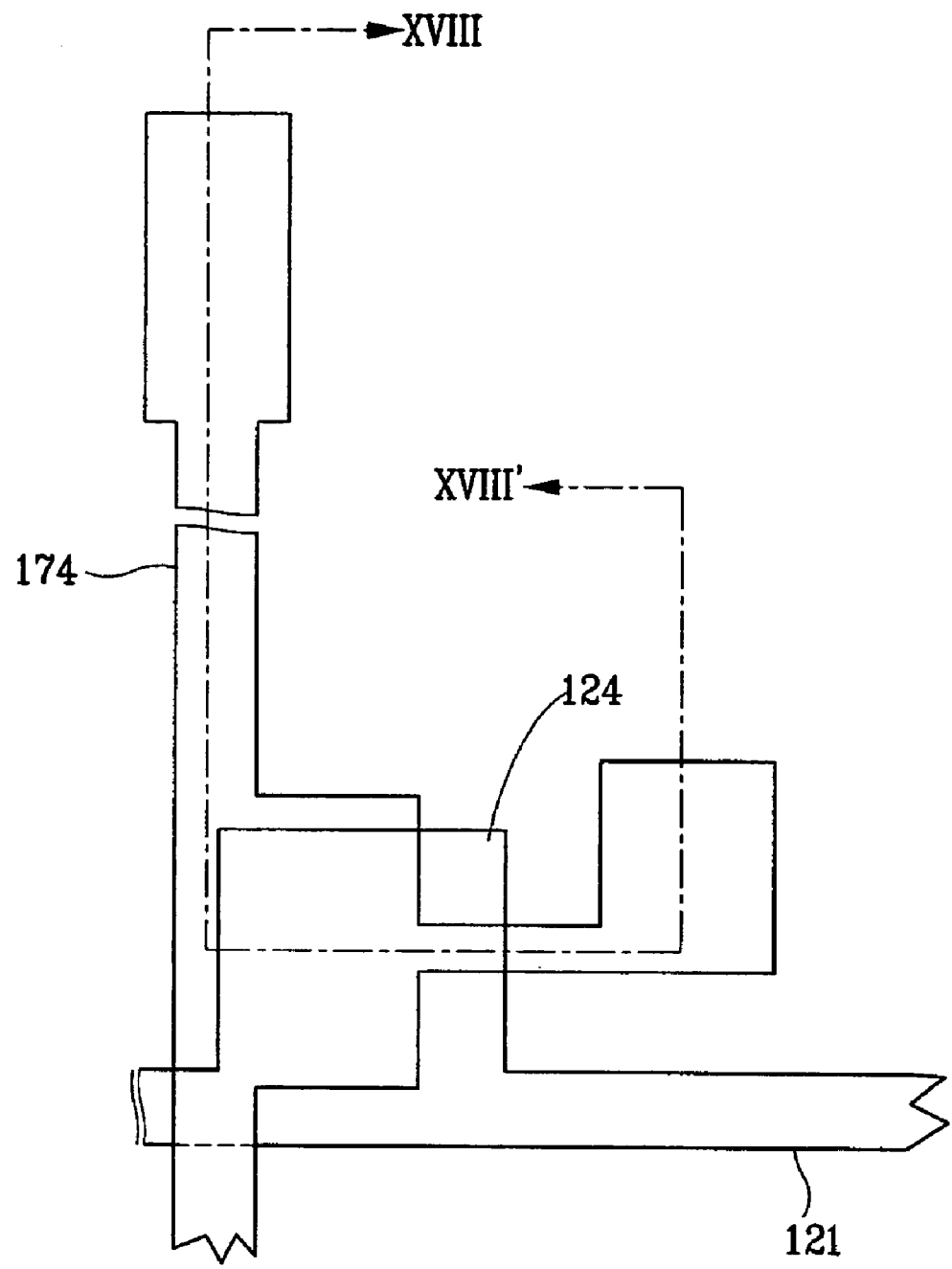
FIG. 17 is a layout view of the TFT array panel in the step following the step shown in FIGS. 15 and 16.
Figure 18:
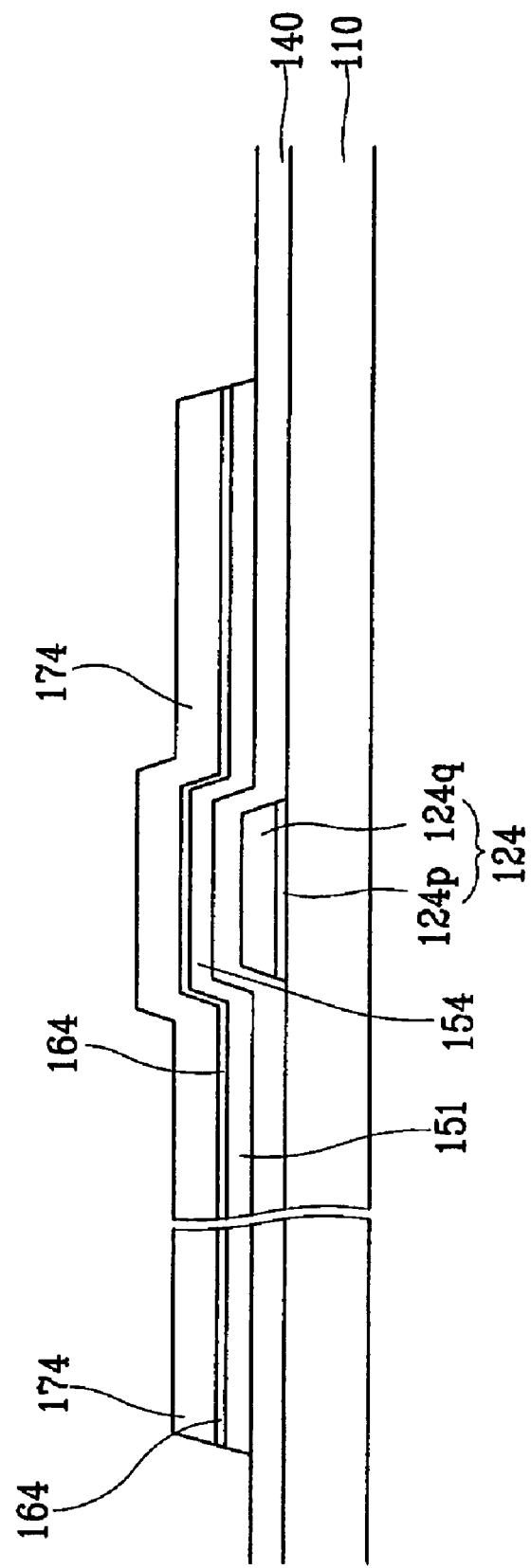
FIG. 18 is a sectional view of the TFT array panel shown in FIG. 17 taken along the lines XVII-XVII'.
Figure 19:
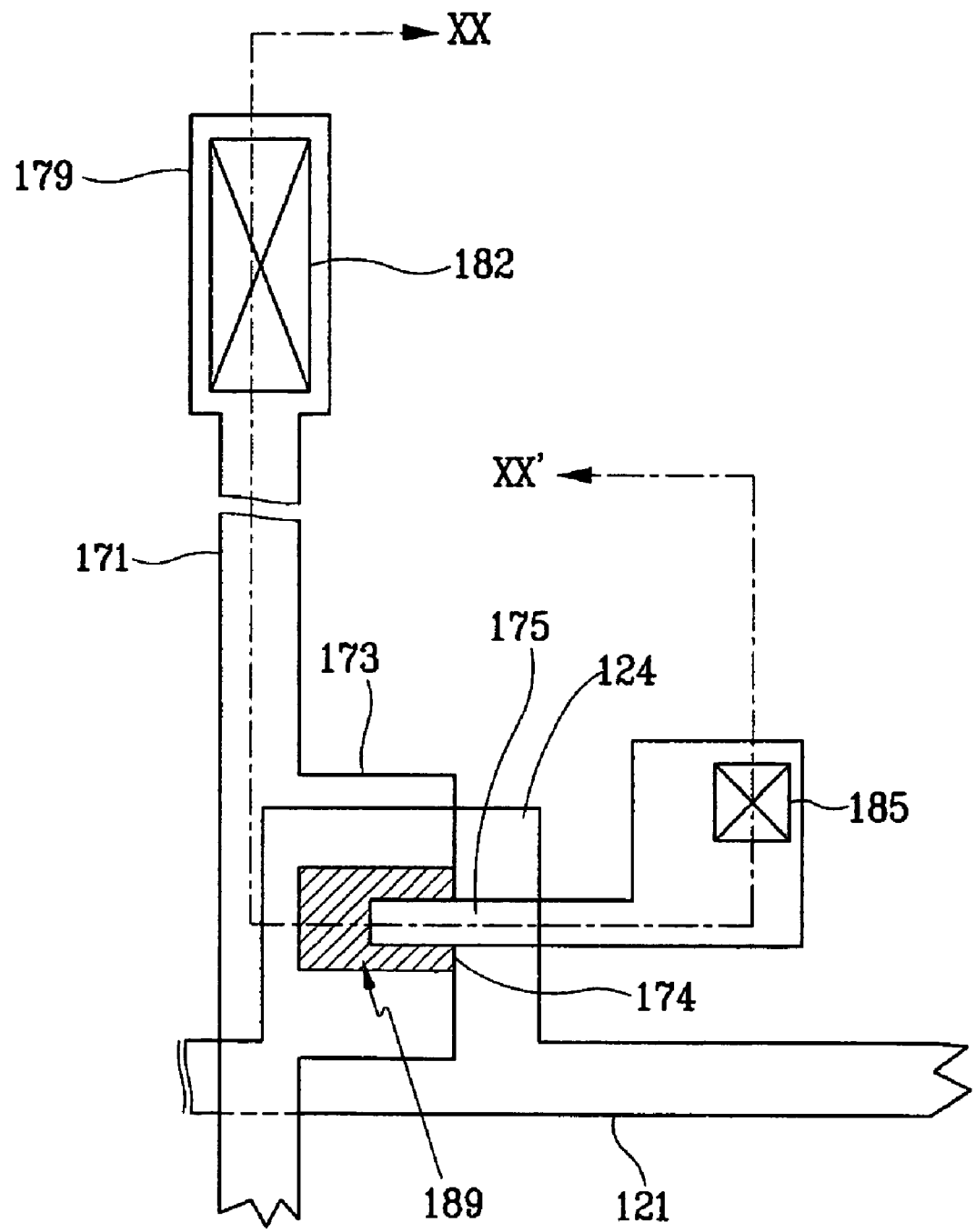
FIG. 19 is a layout view of the TFT array panel in the step following the step shown in FIGS. 17 and 18.
Figure 20:
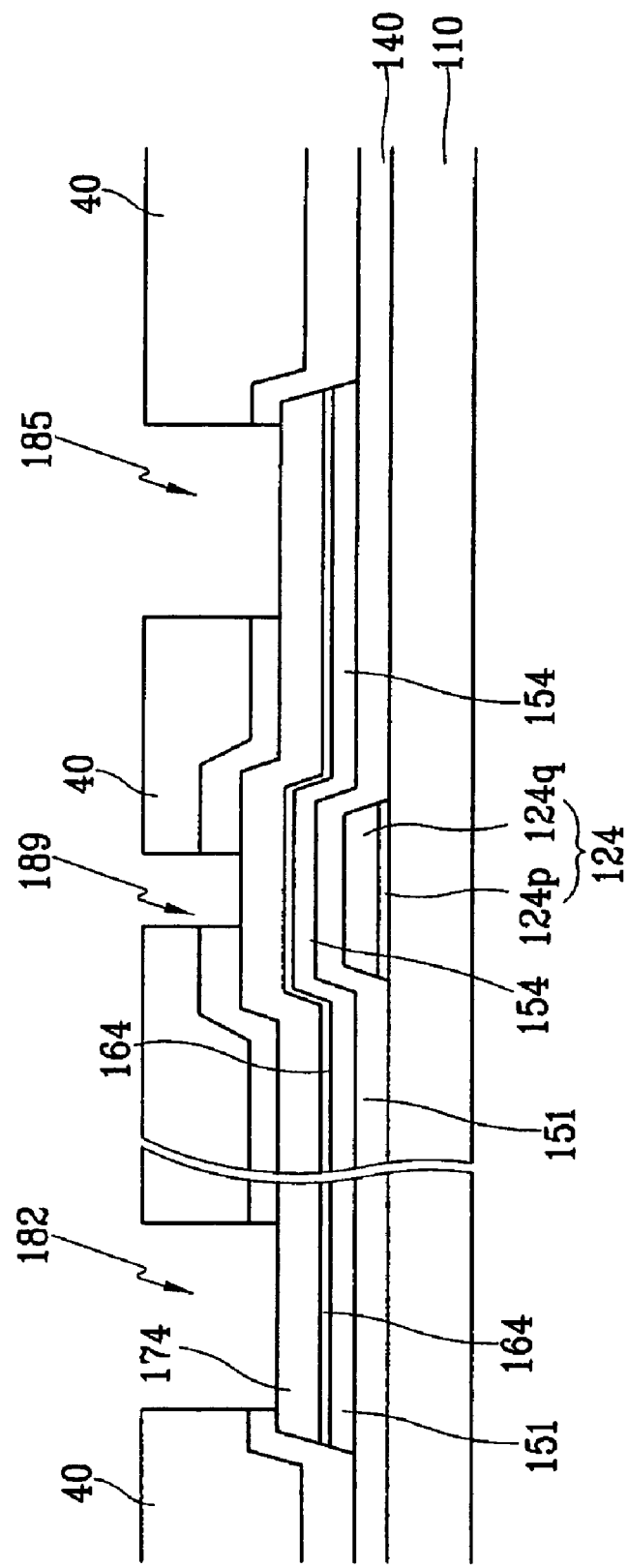
FIG. 20 is a sectional view of the TFT array panel shown in FIG. 19 taken along the lines XX-XX'.
Figure 21:
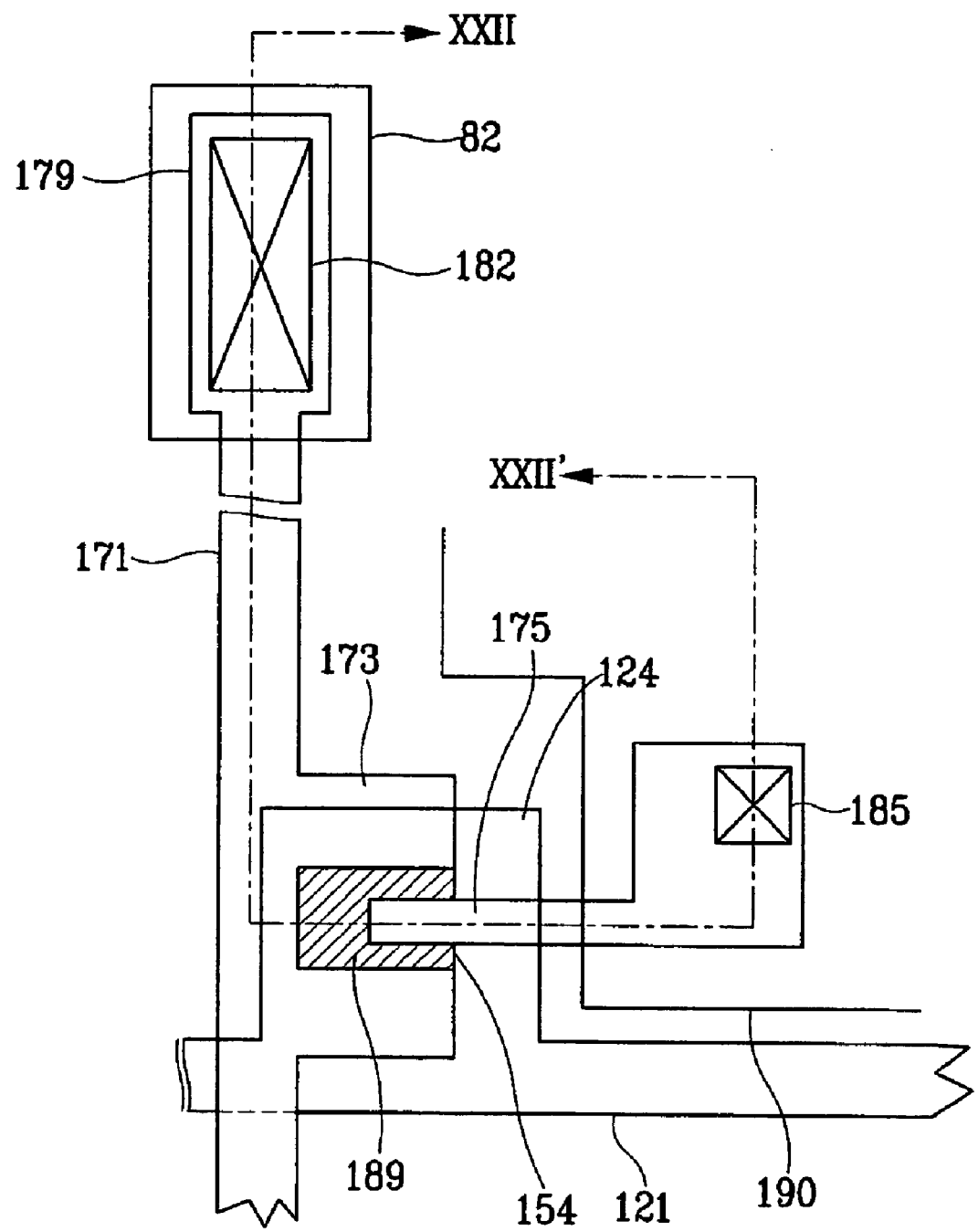
FIG. 21 is a layout view of the TFT array panel in the step following the step shown in FIGS. 19 and 20.
Figure 22:
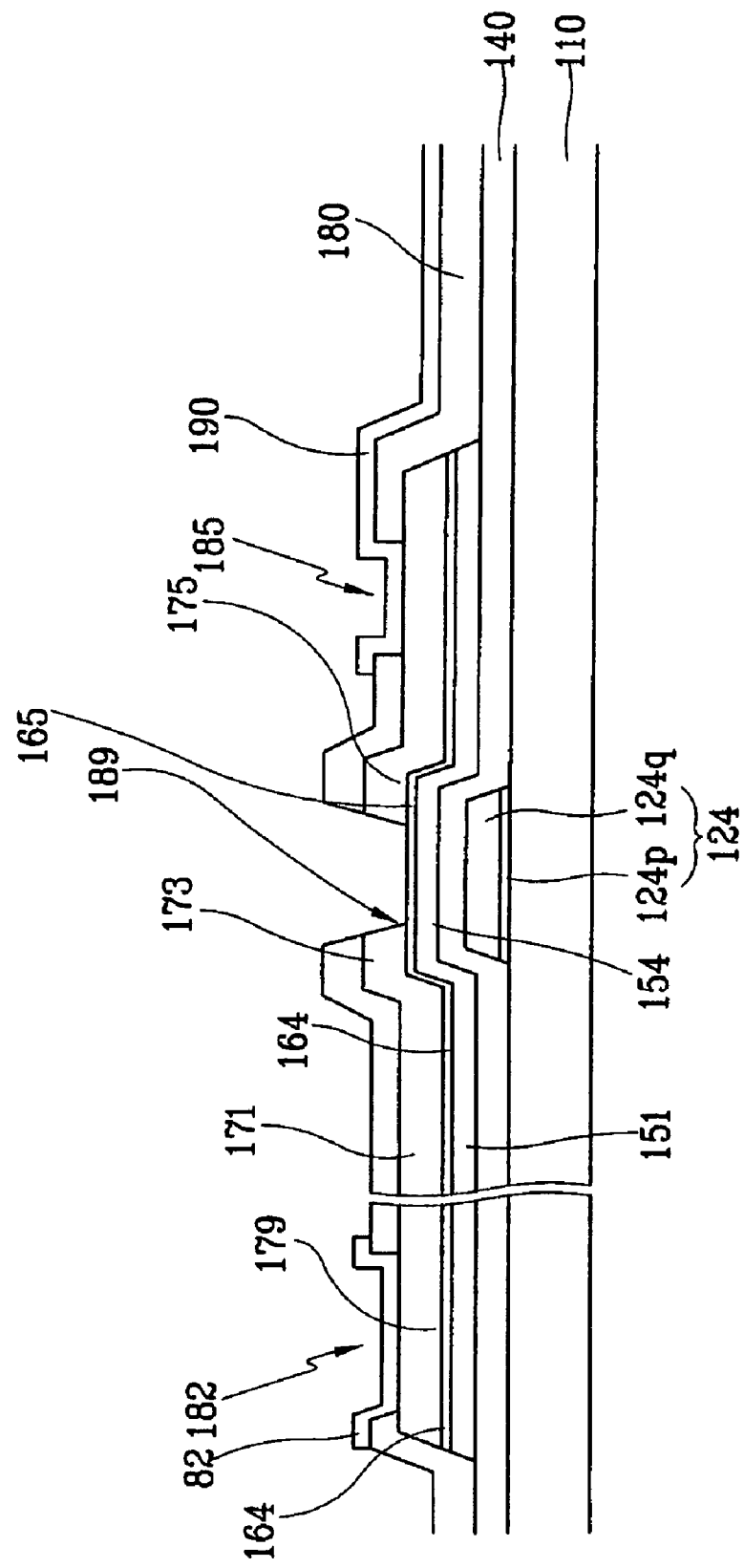
FIG. 22 is a sectional view of the TFT array panel shown in FIG. 21 taken along the lines XXII-XXII'.
Figure 23:
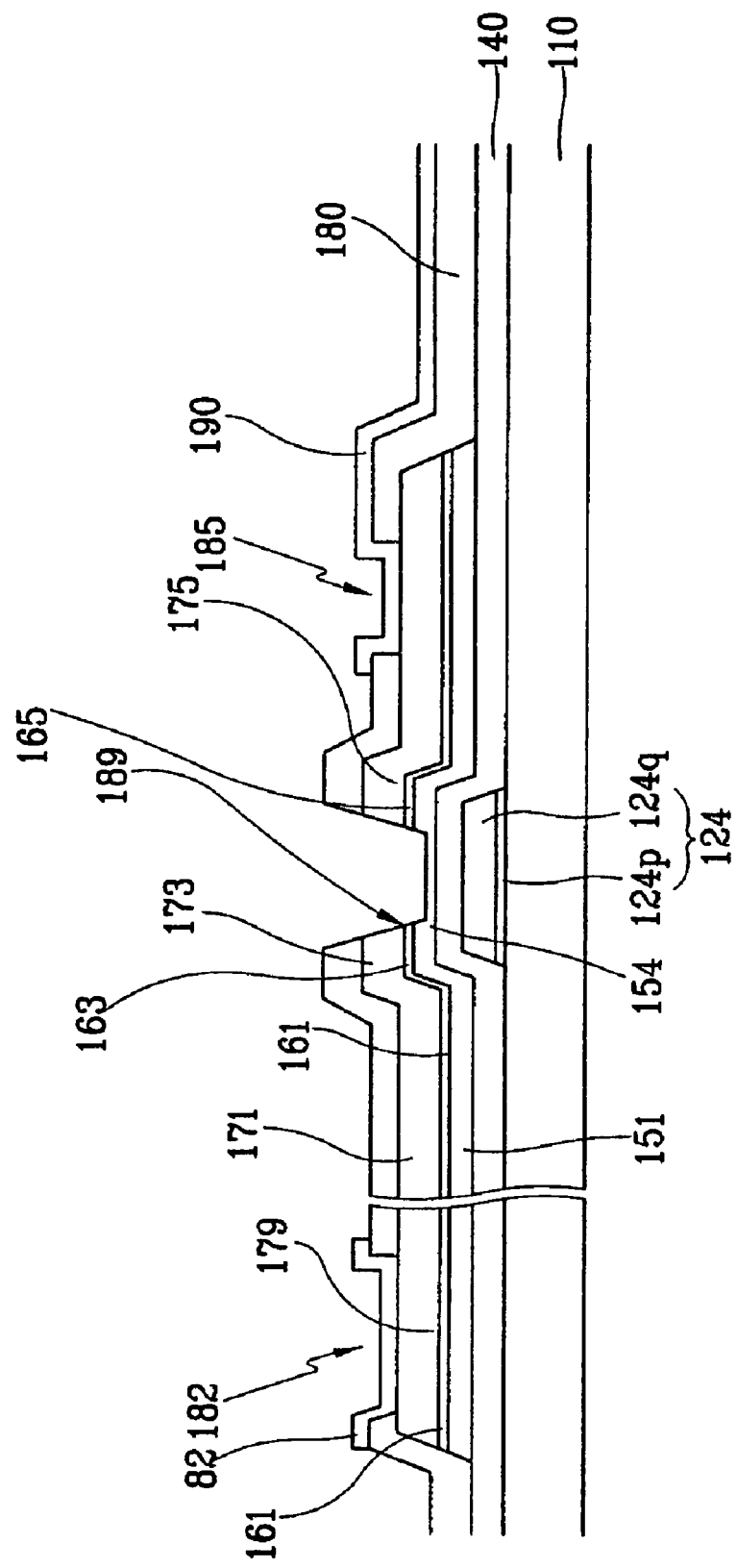
FIG. 23 is a sectional view of the TFT array panel shown in FIG. 21 taken along the lines XXII-XXII', and illustrate the step following the step shown in FIG. 22.

FIG. 15 is a layout view of a TFT array panel shown in FIGS. 13 and 14 in the first step of a manufacturing method thereof according to an embodiment of the present invention; FIG. 16 is a sectional view of the TFT array panel shown in FIG. 15 taken along the lines XVI-XVI'; FIG. 17 is a layout view of the TFT array panel in the step following the step shown in FIGS. 15 and 16; FIG. 18 is a sectional view of the TFT array panel shown in FIG. 17 taken along the lines XVII-XVII'; FIG. 19 is a layout view of the TFT array panel in the step following the step shown in FIGS. 17 and 18; FIG. 20 is a sectional view of the TFT array panel shown in FIG. 19 taken along the lines XX-XX'; FIG. 21 is a layout view of the TFT array panel in the step following the step shown in FIGS. 19 and 20; FIG. 22 is a sectional view of the TFT array panel shown in FIG. 21 taken along the lines XXII-XXII'; and FIG. 23 is a sectional view of the TFT array panel shown in FIG. 21 taken along the lines XXII-XXII', and illustrate the step following the step shown in FIG. 22.

Referring to FIGS. 15 and 16, a plurality of gate lines 121 including gate electrodes 124 are formed on an insulating substrate 110 such as transparent glass.

Referring to FIGS. 17 and 18, a gate insulating layer 140, an intrinsic a-Si layer, an extrinsic a-Si layer, and a conductive layer are deposited in sequence by CVD and sputtering and the conductive layer, the extrinsic a-Si layer, and the intrinsic a-Si layer are photo-etched to form a plurality of conductors 174, a plurality of extrinsic semiconductor stripes 164, and a plurality of intrinsic semiconductor stripes 151 including projections 154 on the gate insulating layer 140.

Referring to FIGS. 19 and 20, a passivation layer 180 preferably having a thickness larger than about 3,000 Å is deposited and a photoresist 40 is formed. The passivation layer 180 is etched using the photoresist 40 as an etch mask to form a plurality of contact holes 182 and 185 and a plurality of openings 189.

Referring to FIGS. 21 and 22, an IZO layer having a thickness of about 400-500 Å is sputtered and photo-etched to form a plurality of pixel electrodes 190 and a plurality of contact assistants 82.

The contact assistants 82 and the pixel electrodes 190 cover the exposed portions of the conductors 174 exposed through the contact holes 182 and 185. However, the exposed portions of the conductors 174 exposed through the openings 189 are not covered yet. The exposed portions of the conductors 174 are removed by blanket etch to expose the extrinsic semiconductor stripes 164 and to complete the data lines 171 and the drain electrodes 175. The IZO layer and the exposed portions of the conductors 174 are simultaneously removable by using a Cr etchant, thereby simplifying the manufacturing process and reducing the manufacturing cost.

Referring to FIG. 23, the exposed portions of the extrinsic semiconductor stripes 164, which are not covered with the data lines 171 and the drain electrodes 175, are removed by blanket etch to complete a plurality of ohmic contact stripes 161 including projections 163 and a plurality of ohmic contact islands 165 and to expose portions of the intrinsic semiconductor stripes 151.

Oxygen plasma treatment may follow thereafter in order to stabilize the exposed surfaces of the semiconductor stripes 151.

Finally, an insulating layer 221 preferably made of silicon nitride or silicon oxide and a layer for a light blocking member 220 are sequentially deposited and patterned to complete the insulating layer 221 and the light blocking member 220 as shown in FIGS. 13 and 14.

A TFT array panel for an LCD according to another embodiment of the present invention will be described in detail with reference to FIGS. 24, 25A and 25B.

Figure 24:
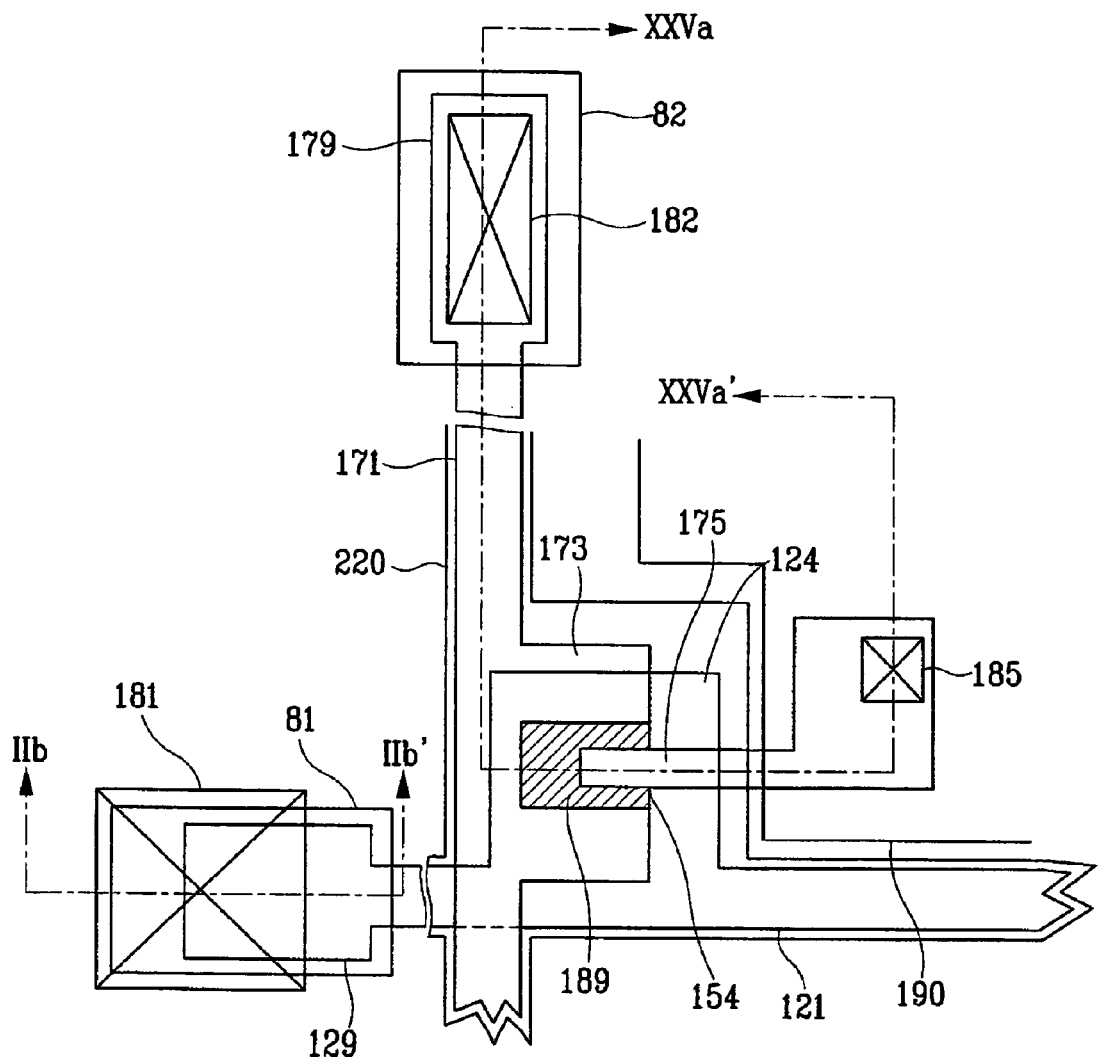
FIG. 24 is a layout view of a TFT array panel for an LCD according to another embodiment of the present invention.
Figure 25B:
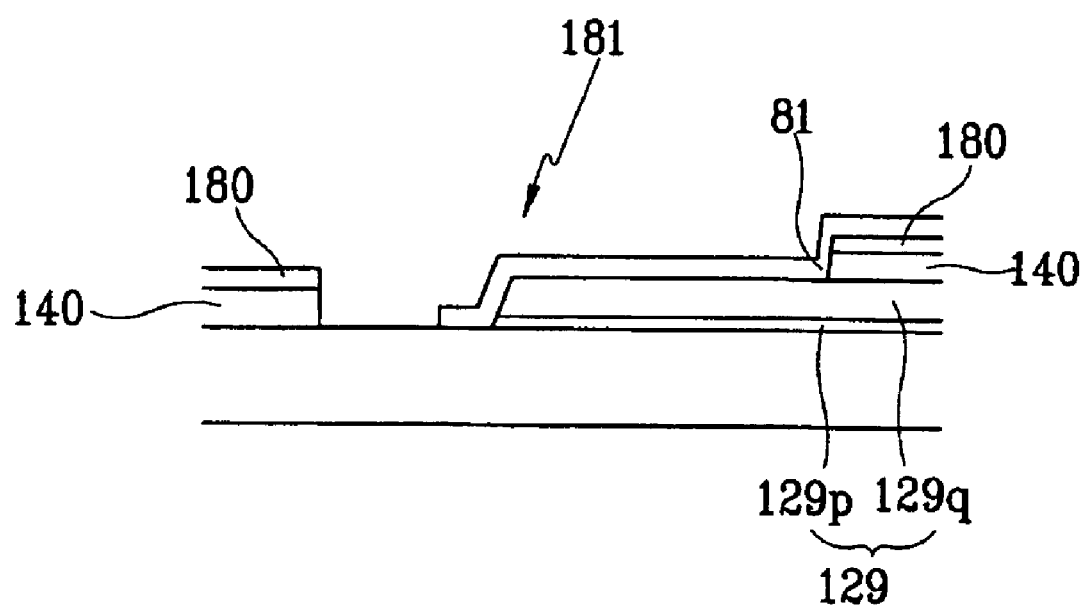

FIG. 24 is a layout view of a TFT array panel for an LCD according to another embodiment of the present invention and FIGS. 25A and 25B are sectional views of the TFT array panel shown in FIG. 24 taken along the line XXVa-XXVa' and XXVb-XXVb', respectively.

Referring to FIGS. 24-25B, a layered structure of the TFT array panel according to this embodiment is almost the same as those shown in FIGS. 13 and 14.

That is, a plurality of gate lines 121 including gate electrodes 124 are formed on a substrate 110, and a gate insulating layer 140, a plurality of semiconductor stripes 151 including projections 154, and a plurality of ohmic contact stripes 161 including projections 163 and a plurality of ohmic contact islands 165 are sequentially formed thereon. A plurality of data lines 171 including source electrodes 173 and a plurality of drain electrodes 175 are formed on the ohmic contacts 161 and 165, and a passivation layer 180 are formed thereon. A plurality of contact holes 182 and 185 and a plurality of openings 189 are provided at the passivation layer 180 and the gate insulating layer 140, and a plurality of pixel electrodes 190 and a plurality of contact assistants 82 are formed on the passivation layer 180. An insulating layer 221 and a light blocking member 220 are formed on the openings 189.

Different from the TFT array panel shown in FIGS. 13 and 14, the gate lines 121 include a lower film 121p preferably made of Al containing metal and an upper film 121q preferably made of Mo containing metal such as Mo or Mo alloy. Each of the gate lines 121 also includes an end portion 129 having a large area for contact with another layer or an external device. In FIGS. 25A and 25B, the lower and the upper films of the gate electrodes 124 are indicated by reference numerals 124p and 124q, respectively, and the lower and the upper films of the end portions 129 are indicated by reference numerals 129p and 129q, respectively.

Furthermore, the passivation layer 180 has a plurality of contact holes 181 exposing the end portions 129 of gate lines 121 and a plurality of contact assistants 81 are provided on the exposed end portions 129 of the gate lines 121. In particular, the contact holes 181 expose edges of the end portions 129 of the gate lines 121 and some portions of the substrate 110 and the contact assistants 81 cover the exposed end portions 129 of the gate lines 121 and the exposed portions of the substrate 110.

In addition, the data lines 171 and the drain electrodes 175 have a triple-layered structure including a lower film 171p and 175q, an intermediate film 171q and 175q, and an upper film 171r and 175r. The lower film 171p and 175q and the upper film 171r and 175r are preferably made of material such as Cr, Mo, Mo alloy, which has good physical, chemical, and electrical contact characteristics with other materials. The intermediate film 171q and 175q is preferably made of low resistivity metal including Al containing metal. Good examples are a lower Mo or Mo alloy film, an intermediate Al (or Al alloy) film, and an upper Mo or Mo alloy film, which are etched under the same etch condition. In FIG. 25A, the lower, intermediate, and the upper films of the source electrodes 173 are indicated by reference numerals 173p, 173q and 173r, respectively, and the lower, intermediate, and upper films of the end portions 179 of the data lines 171 are indicated by reference numerals 179p, 179q and 179r, respectively.

Moreover, the contact holes 181, 182 and 185 expose the upper films 129q, 179r and 175r and the pixel electrodes 190 and the contact assistants 81 and 82 are preferably made of ITO.

Many of the above-described features of the TFT array panel for an LCD shown in FIGS. 13 and 14 may be appropriate to the TFT array panel shown in FIGS. 24-25B.

Now, a method of manufacturing the TFT array panel shown in FIGS. 24-25B will be described in detail with reference to FIGS. 26-34B as well as FIGS. 24-25B.

Figure 26:
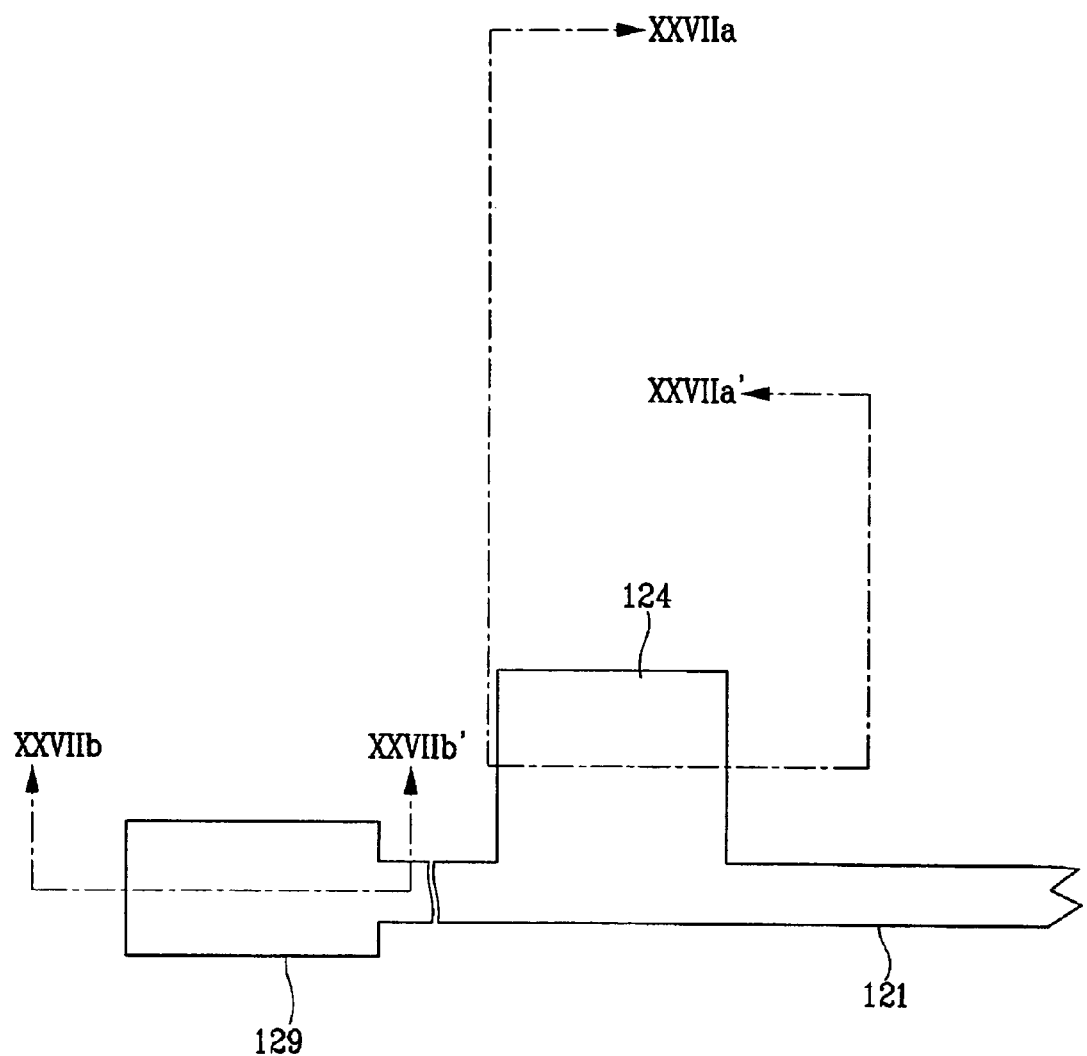
FIG. 26 is a layout view of a TFT array panel shown in FIGS. 24-25B in the first step of a manufacturing method thereof according to an embodiment of the present invention.
Figure 27B:
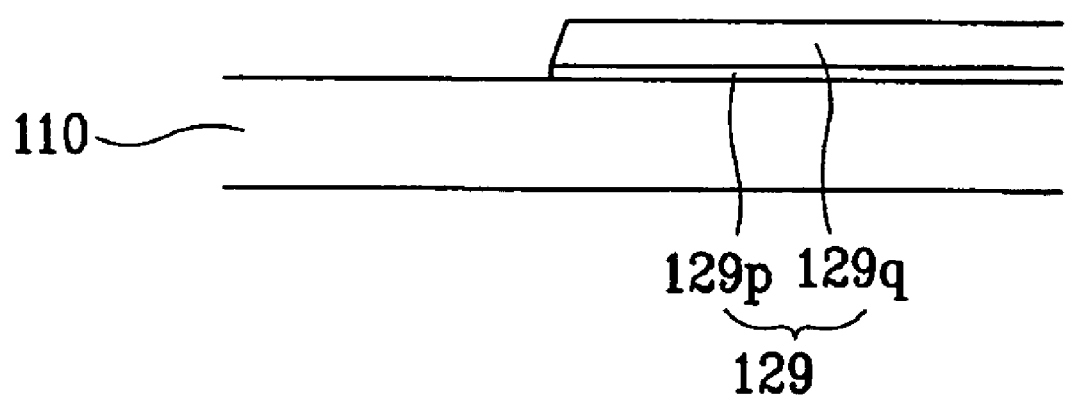
Figure 28:
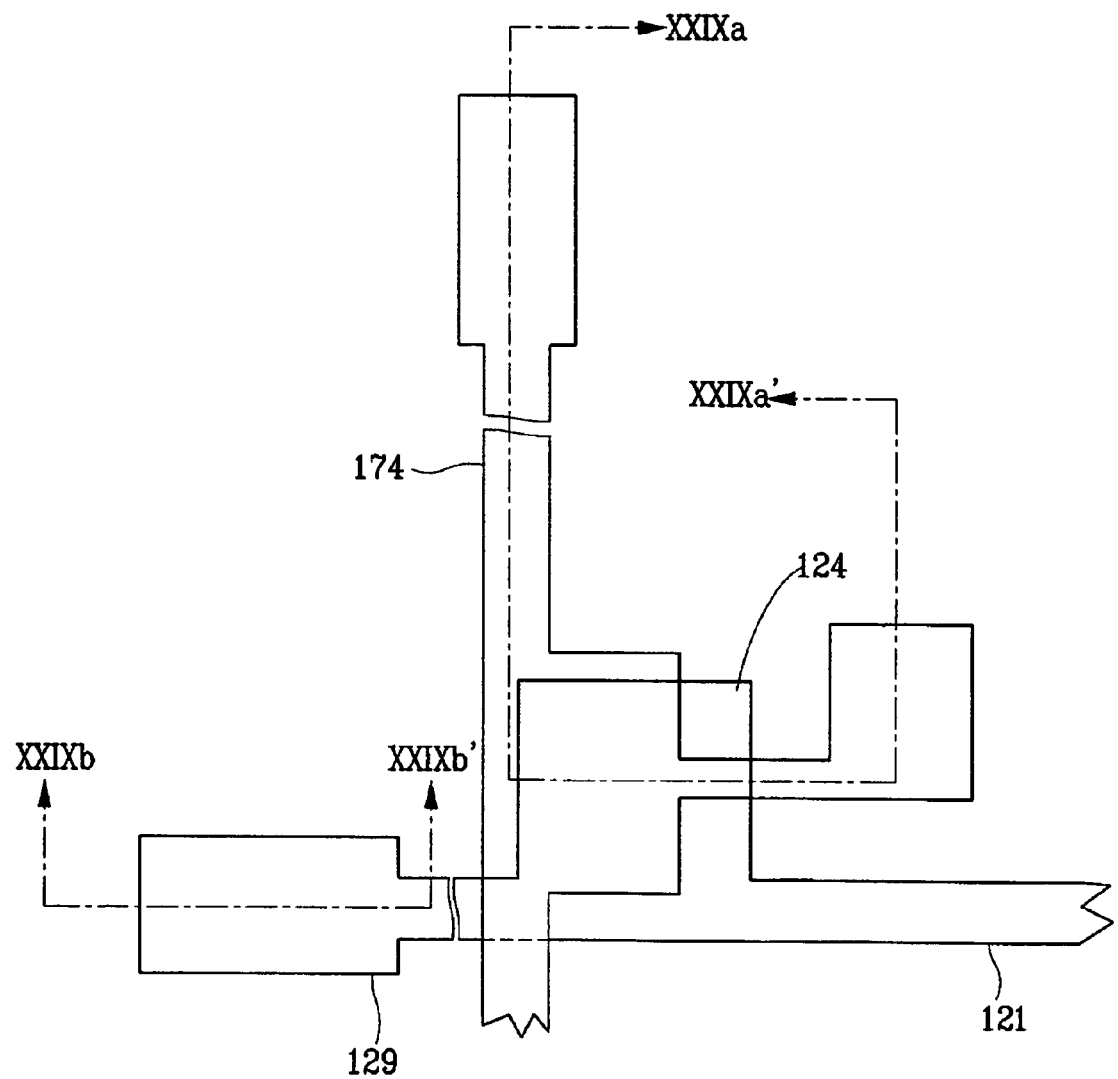
FIG. 28 is a layout view of the TFT array panel in the step following the step shown in FIGS. 26-27B.
Figure 29A:
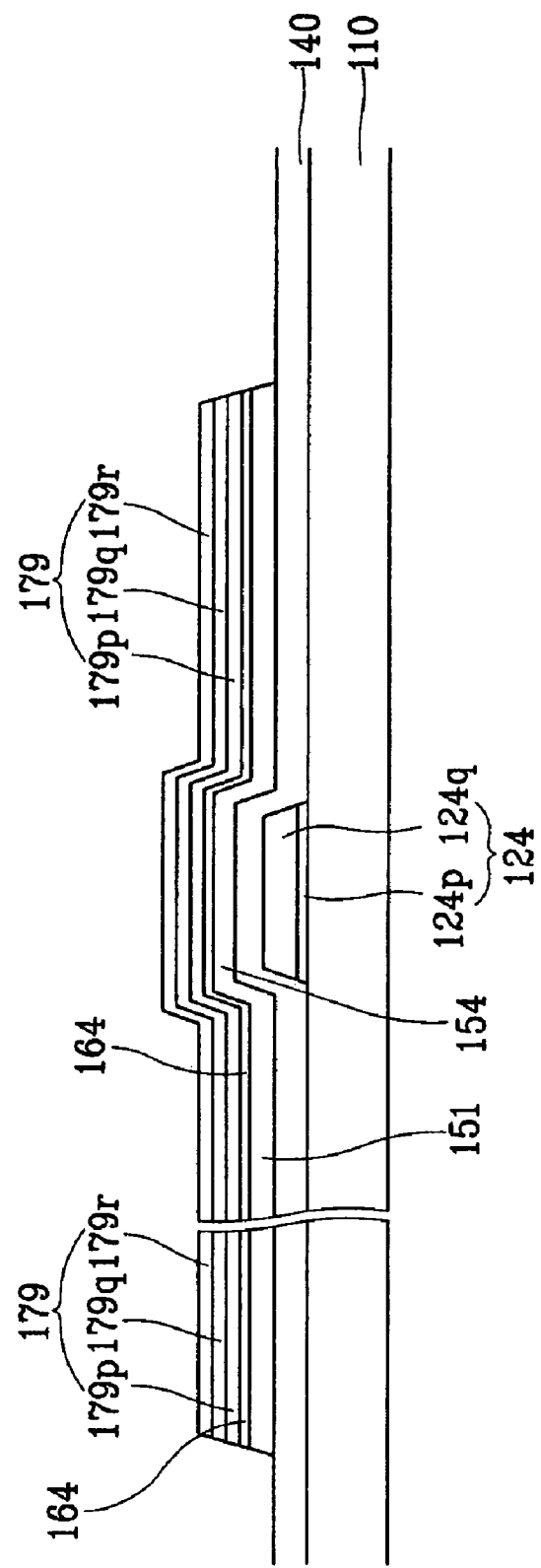
FIGS. 29A and 29B are sectional views of the TFT array panel shown in FIG. 28 taken along the lines XXIXa-XXIXa' and XXIXb-XXIXb', respectively.
Figure 29B:
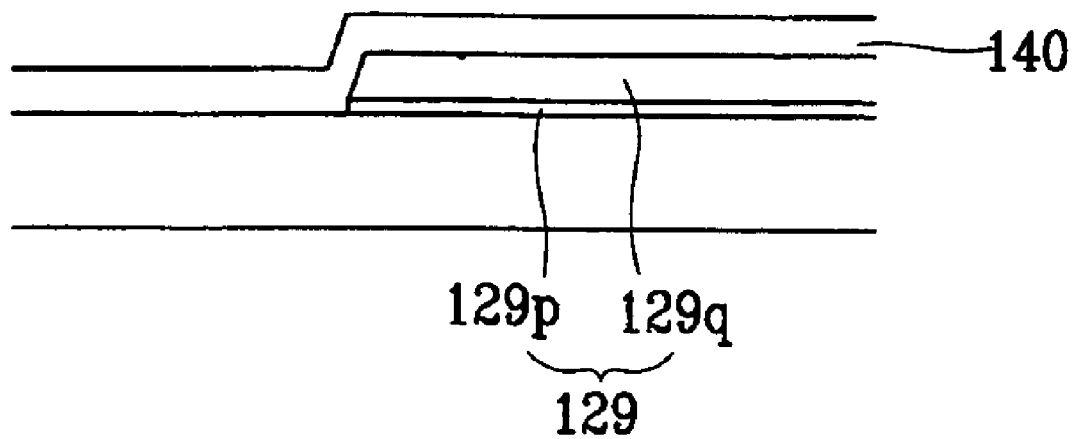
Figure 30:
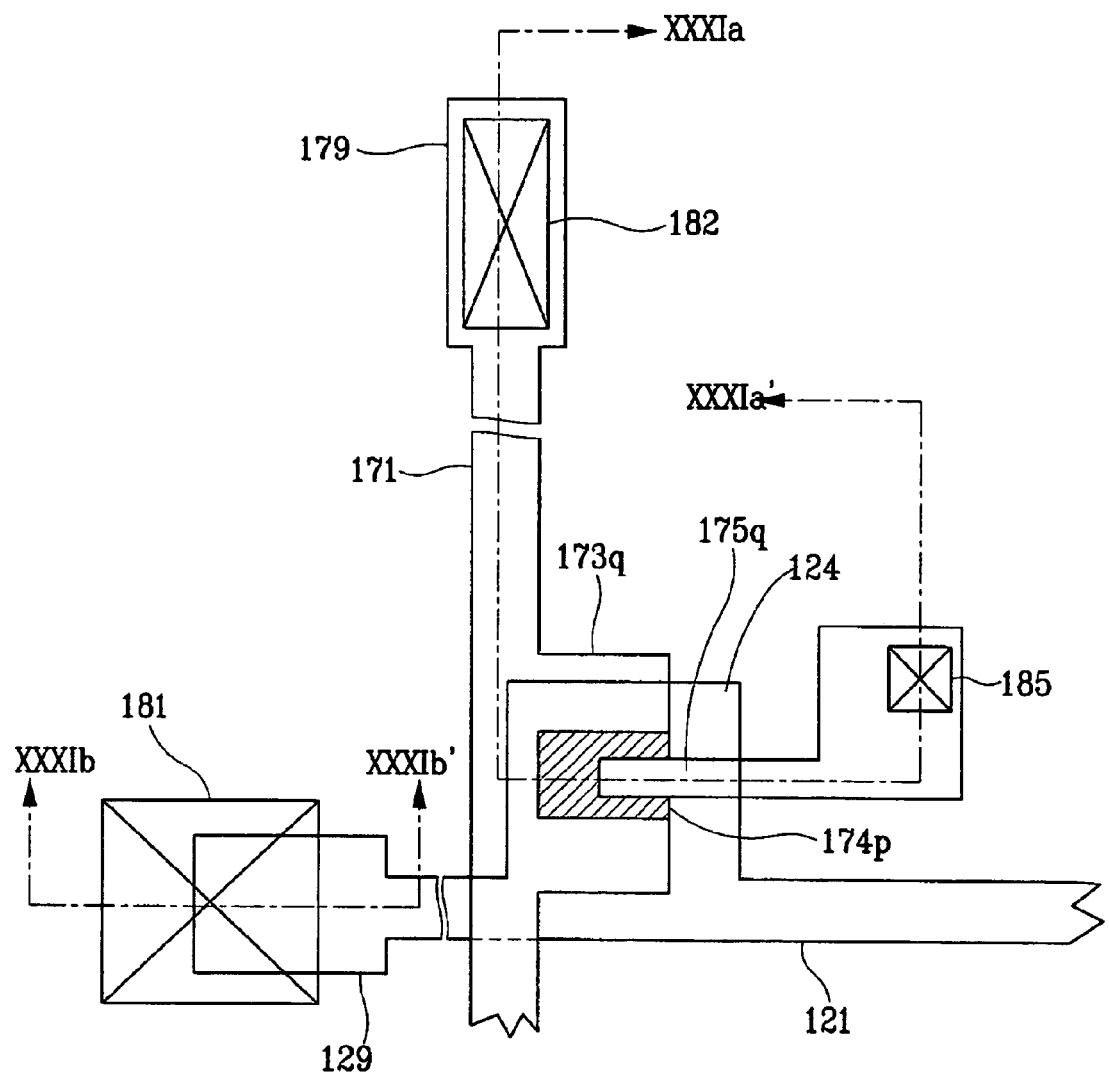
FIG. 30 is a layout view of the TFT array panel in the step following the step shown in FIGS. 28-29B.
Figure 31A:
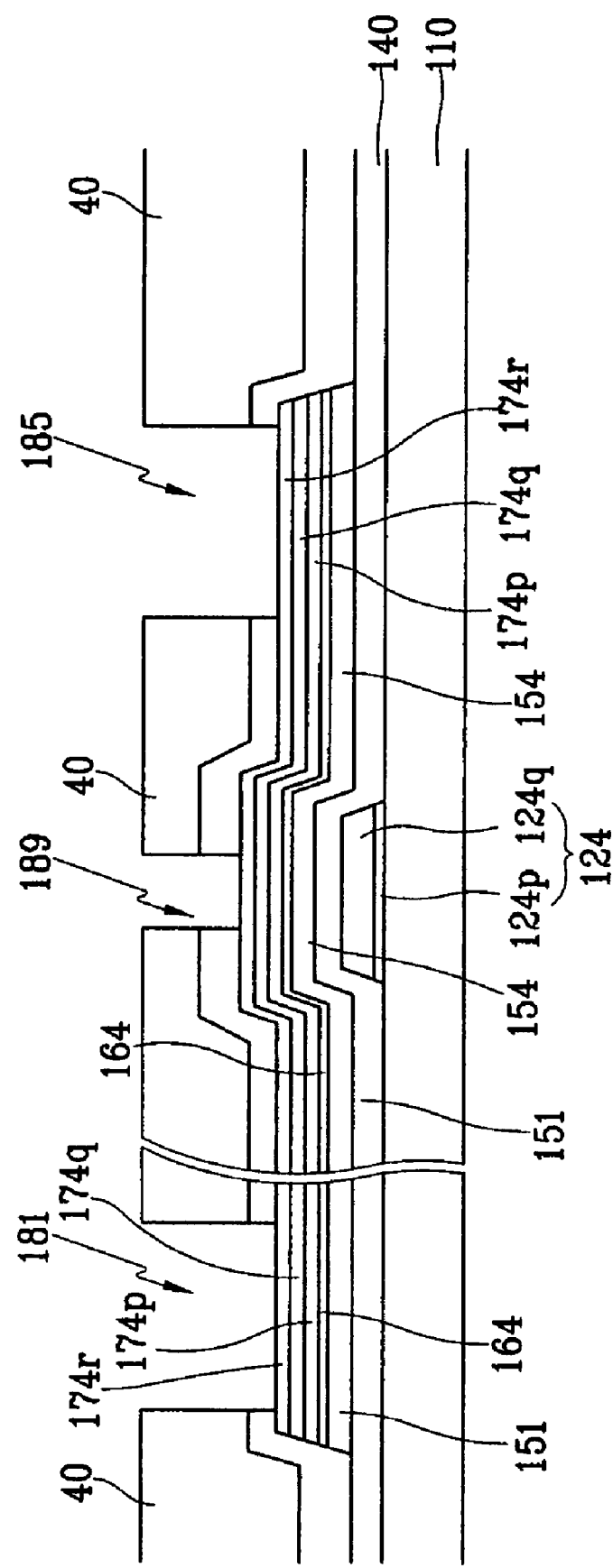
FIGS. 31A and 31B are sectional views of the TFT array panel shown in FIG. 30 taken along the lines XXXIa-XXIXa' and XXXIb-XXIXb', respectively.
Figure 31B:
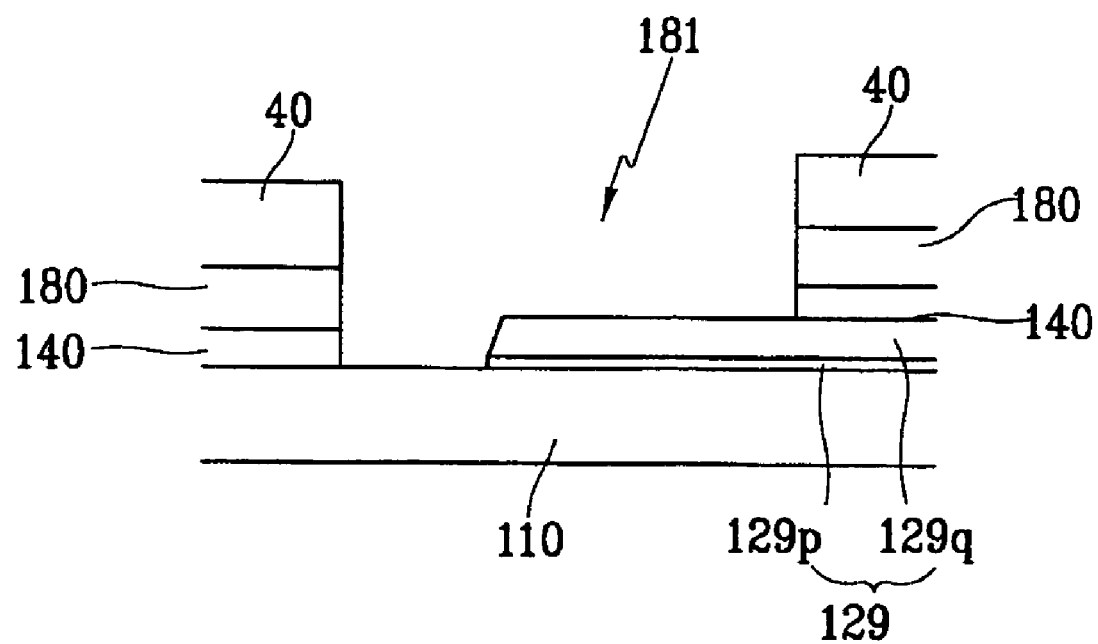
Figure 32:
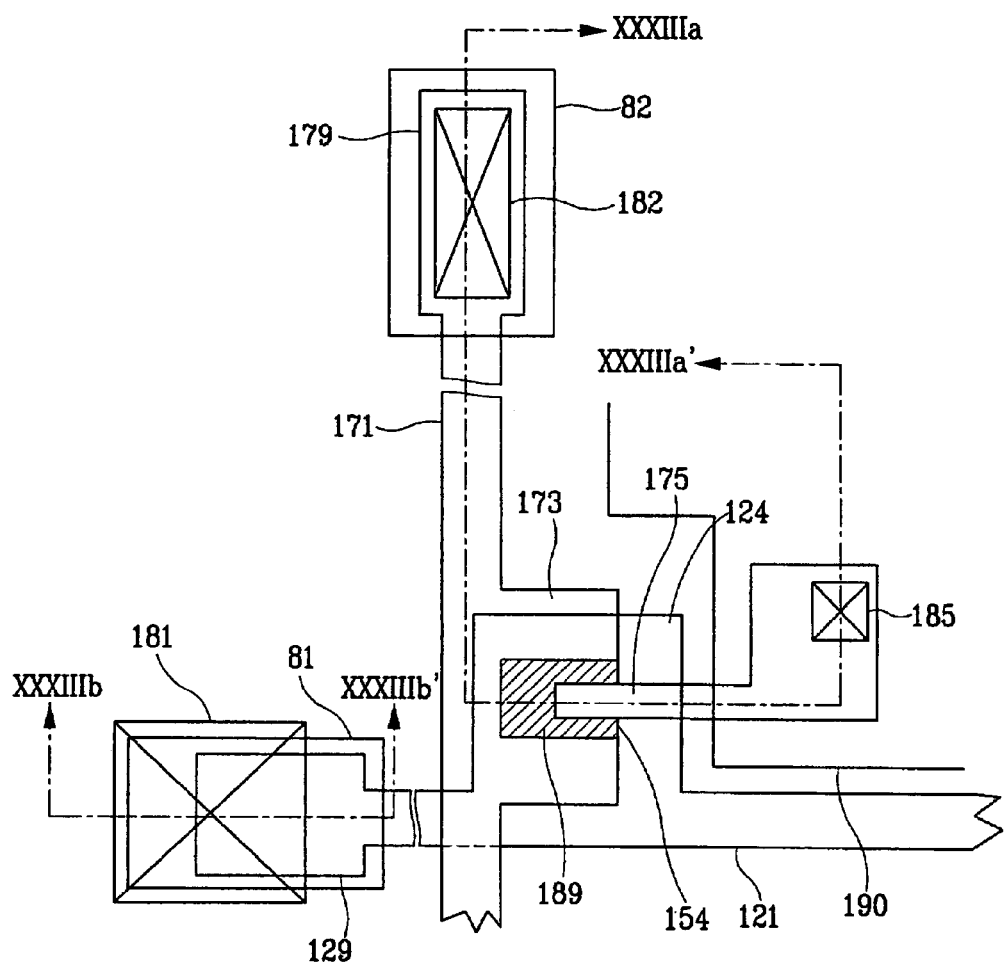
FIG. 32 is a layout view of the TFT array panel in the step following the step shown in FIGS. 30-31B.
Figure 33A:
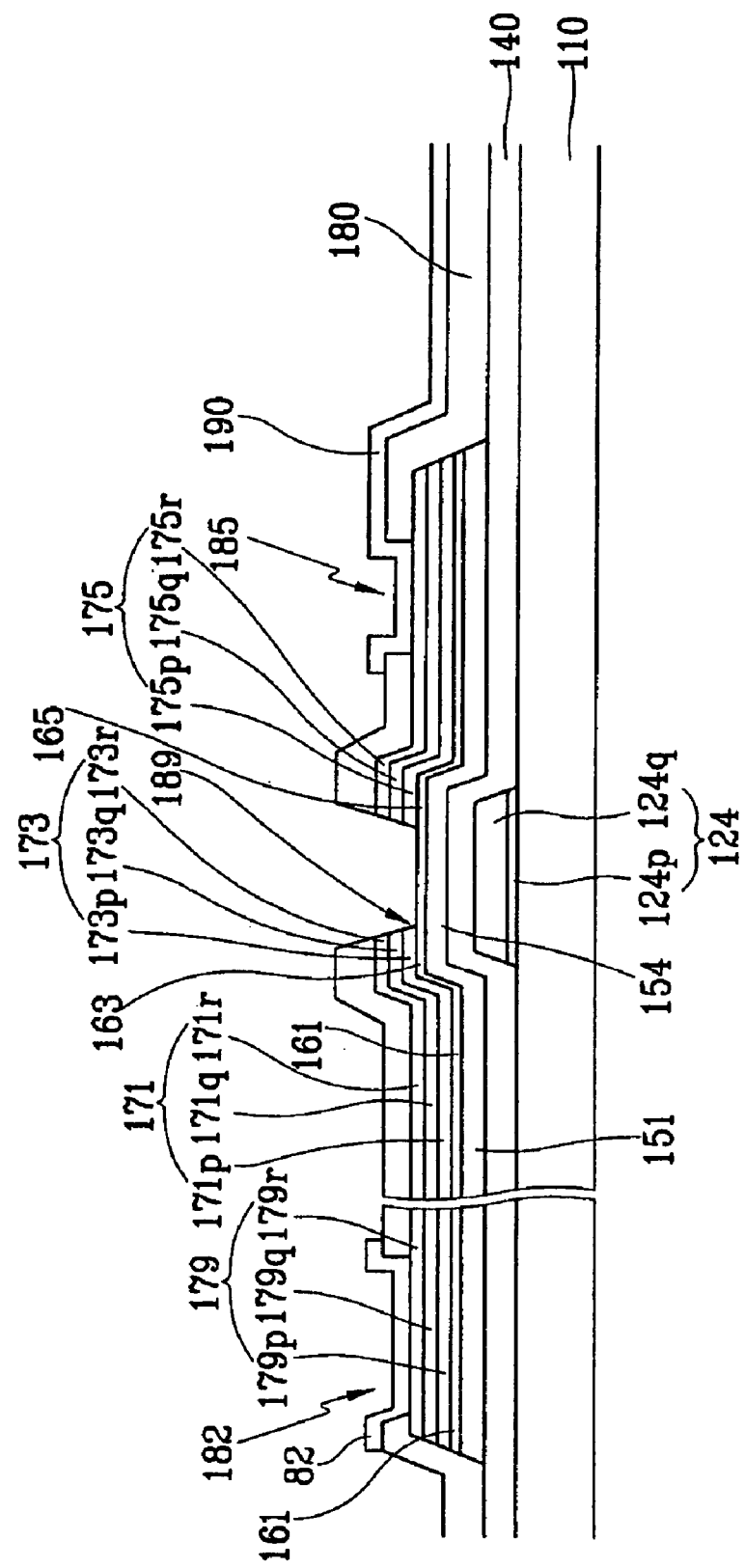
FIGS. 33A and 33B are sectional views of the TFT array panel shown in FIG. 32 taken along the lines XXXIIIa-XXXIIIa' and XXXIIIb-XXXIIIb', respectively.
Figure 33B:
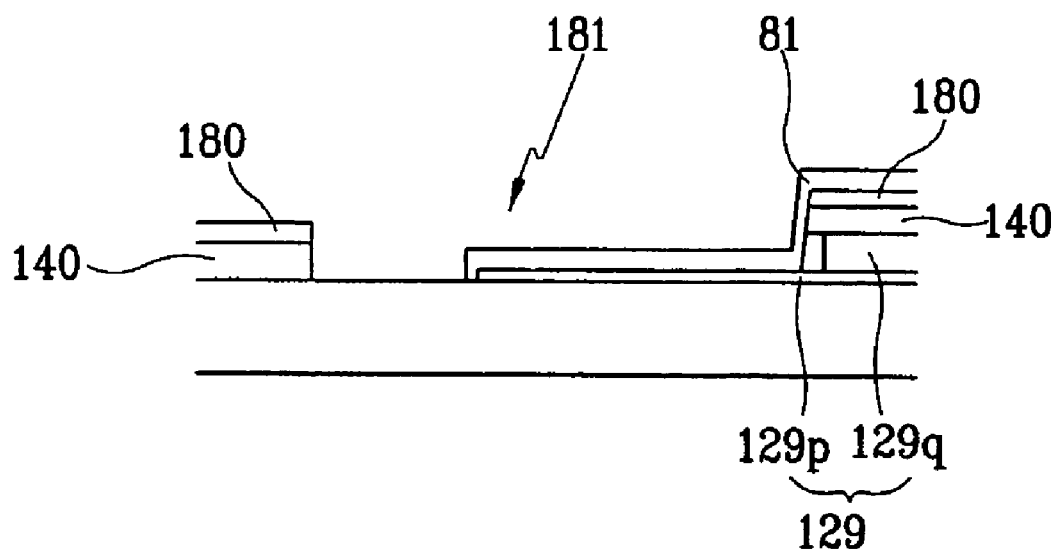
Figure 34A:
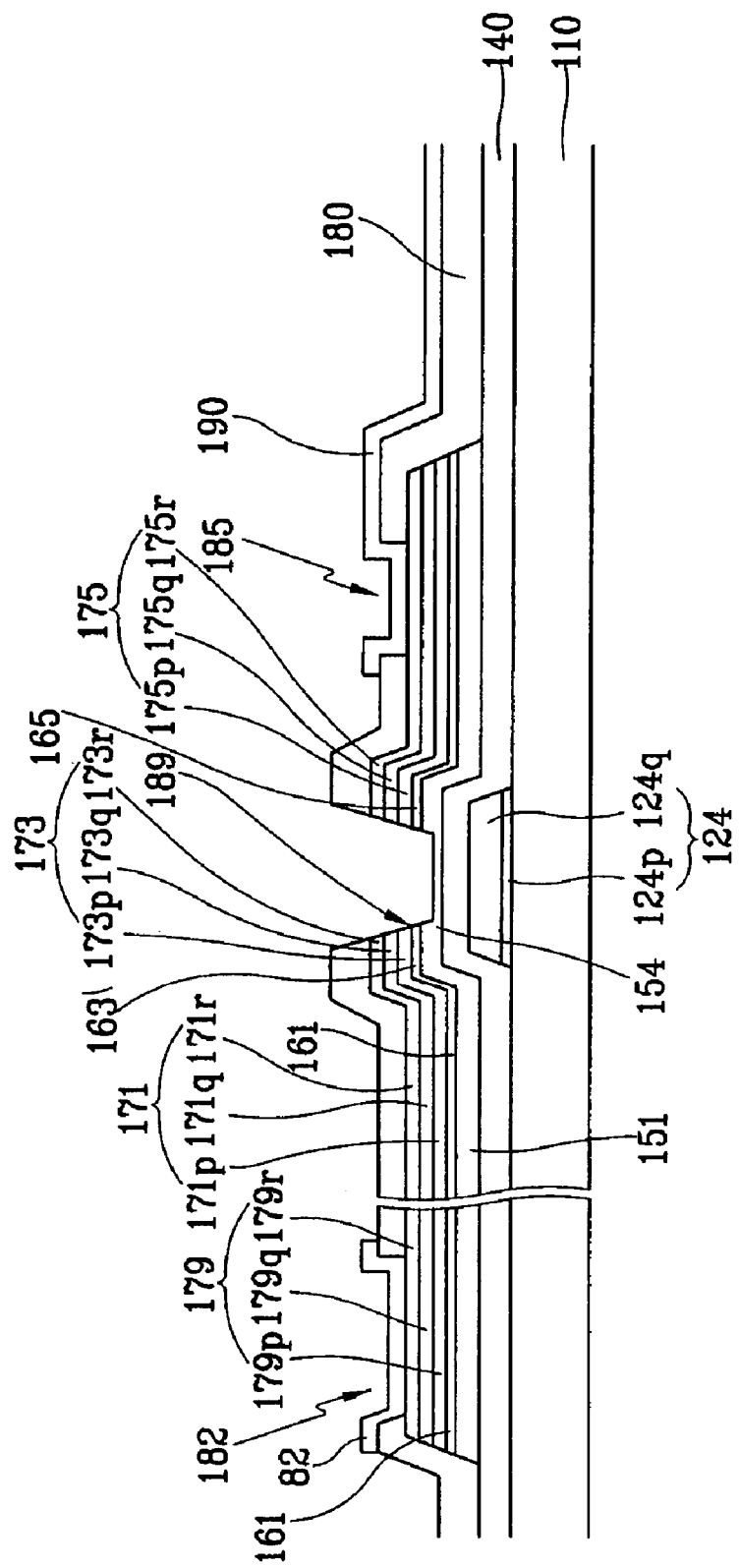
FIGS. 34A and 34B is a sectional view of the TFT array panel shown in FIG. 32 taken along the lines XXXIIIa-XXXIIIa' and XXXIIIb-XXXIIIb', respectively, and illustrate the step following the step shown in FIGS. 33A and 33B.
Figure 34B:
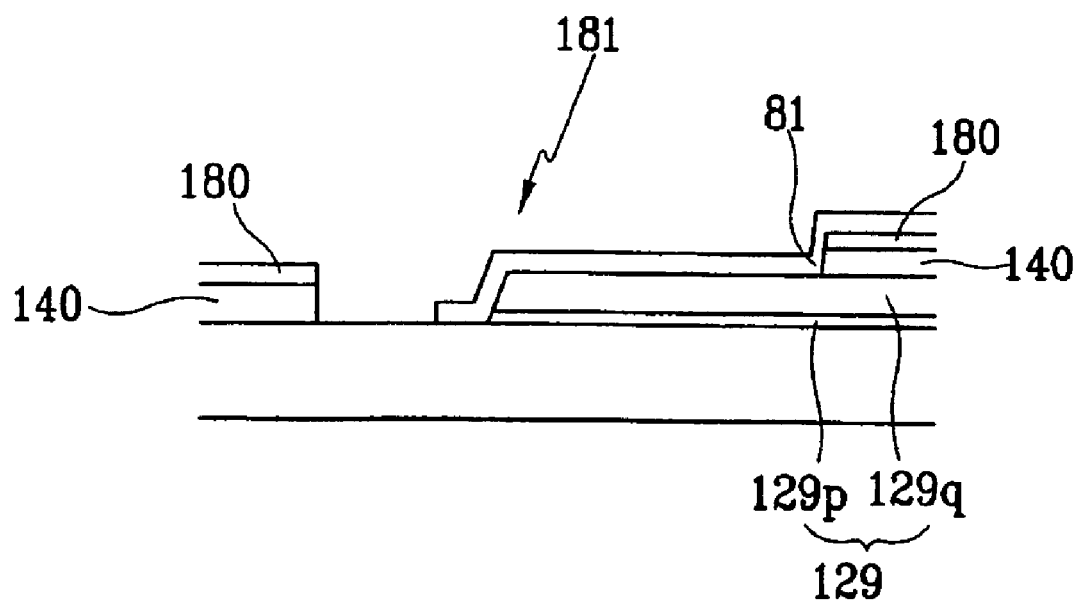

FIG. 26 is a layout view of a TFT array panel shown in FIGS. 24-25B in the first step of a manufacturing method thereof according to an embodiment of the present invention; FIGS. 27A and 27B are sectional views of the TFT array panel shown in FIG. 26 taken along the lines XXVIIa-XXVIIa' and XXVIIb-XXVIIb', respectively; FIG. 28 is a layout view of the TFT array panel in the step following the step shown in FIGS. 26-27B; FIGS. 29A and 29B are sectional views of the TFT array panel shown in FIG. 28 taken along the lines XXIXa-XXIXa' and XXIXb-XXIXb', respectively; FIG. 30 is a layout view of the TFT array panel in the step following the step shown in FIGS. 28-29B; FIGS. 31A and 31B are sectional views of the TFT array panel shown in FIG. 30 taken along the lines XXXIa-XXIXa' and XXXIb-XXIXb', respectively; FIG. 32 is a layout view of the TFT array panel in the step following the step shown in FIGS. 30-31B; FIGS. 33A and 33B are sectional views of the TFT array panel shown in FIG. 32 taken along the lines XXXIIIa-XXXIIIa' and XXXIIIb-XXXIIIb', respectively; and FIGS. 34A and 34B is a sectional view of the TFT array panel shown in FIG. 32 taken along the lines XXXIIIa-XXXIIIa' and XXXIIIb-XXXIIIb', respectively, and illustrate the step following the step shown in FIGS. 33A and 33B.

Referring to FIGS. 26-27B, a plurality of gate lines 121 including a plurality of gate electrodes 124 are formed on an insulating substrate 110 such as transparent glass. The gate lines 121 include two conductive films, a lower conductive film preferably made of Al and an upper conductive film preferably made of Mo. The lower and upper films of the gate electrodes 124 are indicated by 124p and 124q, respectively, in FIGS. 27A and 27B. The upper and lower films of the gate lines 121 can be simultaneously etched by using an Al etchant to have a tapered edge profile.

Referring to FIGS. 28-29B, a gate insulating layer 140, an intrinsic a-Si layer, an extrinsic a-Si layer, and a conductive layer including lower, intermediate, and upper films are deposited in sequence by CVD and sputtering and the conductive layer, the extrinsic a-Si layer, and the intrinsic a-Si layer are photo-etched to form a plurality of conductors 174 including lower, intermediate, and upper conductors 174p, 174p and 174r, a plurality of extrinsic semiconductor stripes 164, and a plurality of intrinsic semiconductor stripes 151 including a plurality of projections 154 on the gate insulating layer 140.

The lower and upper conductors 174p and 174r are preferably made of Mo or Mo alloy having a thickness of about 500 Å, and the intermediate conductor 174q is preferably made of Al or Al alloy having a thickness of about 1,000-3,000 Å, preferably about 2,500 Å. A sputtering target for Al preferably includes pure Al or Al—Nd alloy containing 2 atomic % Nd, and a sputtering temperature is preferably about 150 degrees.

Referring to FIGS. 30-31B, a passivation layer 180 preferably having a thickness larger than about 3,000 Å is deposited and a photoresist 50 is formed. The passivation layer 180 are etched using the photoresist 50 as an etch mask to form a plurality of contact holes 181, 182 and 185 and a plurality of openings 189 exposing end portions 129 of the gate lines and portions of the upper conductors 174r.

Referring to FIGS. 32-33B, an ITO layer having a thickness of about 400-500 Å is sputtered. Thereafter, a photoresist (not shown) is formed and the TFT array panel is subjected to wet etch condition with an etchant for ITO, which can also etch Al and Mo (alloy) such that a plurality of pixel electrodes 190 and a plurality of contact assistants 81 and 82 covering the exposed portions of the conductors 174 through the contact holes 181, 182 and 185 are formed and, simultaneously, the exposed portions of the conductors 174 through the openings 189 are removed to form a plurality of data lines 171 including source electrodes 173 and end portions 179 and a plurality drain electrodes 175 and to expose portions of the extrinsic semiconductor stripes 164. Any etchant for Al containing $HNO_3$, $H_3PO_4$, and $CH_3COOH$ can be used in this step.

Referring to FIGS. 34A and 34B, the exposed portions of the extrinsic semiconductor stripes 164, which are not covered with the data lines 171 and the drain electrodes 175, are removed by blanket etch to complete a plurality of ohmic contact stripes 161 including a plurality of projections 163 and a plurality of ohmic contact islands 165 and to expose portions of the intrinsic semiconductor stripes 151.

Oxygen plasma treatment may follow thereafter in order to stabilize the exposed surfaces of the semiconductor stripes 151.

Finally, a light blocking member 220 are formed on the exposed portions of the semiconductor stripes 151 as shown in FIGS. 24-25B.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of manufacturing a thin film transistor array panel, the method comprising:
forming a gate line on a substrate;
depositing a first insulating layer, a semiconductor layer, and a conductive layer in sequence on the gate line;
photo-etching the conductive layer and the semiconductor layer simultaneously to form a semiconductor pattern and a conductive pattern;
depositing a second insulating layer on the first insulating layer and the conductive pattern;
photo-etching the second insulating layer to expose first and second portions of the conductive layer;
forming a pixel electrode of light transmitting material on the first portion of the conductive layer and forming a redundant source pattern and a redundant drain portion covering a portion of the second portions of the conductive pattern;
removing the second portion of the conductive layer not covered with the redundant source pattern and the redundant drain pattern to form a source electrode and a drain electrode and to expose a portion of the semiconductor layer; and
forming a light blocking member on the exposed portion of the semiconductor layer, the light blocking member having an opening exposing the pixel electrode.

2. The method of claim 1, further comprising:
forming a third insulating layer between the semiconductor layer and the light blocking member.

3. The method of claim 2, wherein the third insulating layer has substantially the same planar shape as the light blocking member.

4. The method of claim 1, wherein the photo-etching of the second insulating layer comprises: exposing a third portion of the conductive layer.

5. The method of claim 4, further comprising: forming a contact assistant on the third portion of the conductive layer.

6. The method of claim 1, wherein the photo-etching of the second insulating layer comprises: exposing a portion of the gate line.

7. The method of claim 6, further comprising: forming a contact assistant on the exposed portion of the gate line.

8. The method of claim 1, wherein the gate line comprises a lower film and an upper film.

9. The method of claim 8, wherein the photo-etching of the second insulating layer comprises: etching the first insulating layer to expose a portion of the upper film of the gate line.

10. The method of claim 9, further comprising: removing the exposed portion of the upper film of the gate line to expose a portion of the lower film of the gate line.

11. The method of claim 1, wherein the semiconductor layer comprises an intrinsic film and an extrinsic film, and the method further comprises: removing the exposed portion of the extrinsic film after removing the second portion of the conductive layer.

12. The method of claim 1, wherein photo-etching of the second insulating layer exposes the first portion of the conductive layer and an exposed portion of the first insulating layer.

13. A method of manufacturing a thin film transistor array panel, the method comprising:
forming a gate line on a substrate;
depositing a first insulating layer and a semiconductor layer in sequence on the gate line;
depositing a conductive layer on the semiconductor layer;
photo-etching the conductive layer and the semiconductor layer;
depositing a second insulating layer;
photo-etching the second insulating layer to expose first and second portions of the conductive layer;
forming a pixel electrode on the first portion of the conductive layer;
removing the second portion of the conductive layer to expose a portion of the semiconductor layer; and
forming a light blocking member on the exposed portion of the semiconductor layer, the light blocking member having an opening exposing the pixel electrode, wherein the formation of the pixel electrode and the removal of the second portion of the conductive layer are simultaneously performed.

14. The method of claim 13, wherein the conductive layer comprises Cr.

15. The method of claim 14, wherein the pixel electrode comprises IZO.

16. The method of claim 13, wherein the gate line and the conductive layer comprises Al or Mo.

17. The method of claim 16, wherein the gate line and the conductive layer comprises Al and Mo.

18. The method of claim 16, wherein the pixel electrode comprises ITO.

19. The method of claim 13, wherein the conductive layer comprises a lower film and an upper film, the photo-etching of the second insulating layer comprises: removing the first and second portions of the conductive layer to expose the first and second portions of the upper film, and forming first and second redundant electrodes on the second portion of the conductive layer.

20. The method of claim 19, wherein the upper film comprises Cr, and the pixel electrodes and the first and the second redundant electrodes comprise IZO.

21. The method of claim 20, wherein the formation of a pixel electrode, the formation of first and second redundant electrodes, and the removal of the second portion of the conductive layer are simultaneously performed.

22. The method of claim 21, wherein the formation of a pixel electrode, the formation of first and second redundant electrodes, and the removal of the second portion of the conductive layer are performed with a single etch condition.

23. A method of manufacturing a thin film array panel having a bottom gate transistor formed with a light blocking member over an exposed region of a semiconductor layer and including at least one conductive layer overlying the semiconductor layer, the method comprising: forming a pixel electrode; and, simultaneously with the forming of the pixel electrode, removing a portion of the conductive layer to expose the semiconductor layer.

* * * * *